United States Patent
Nakata et al.

(10) Patent No.: US 6,620,744 B2
(45) Date of Patent: Sep. 16, 2003

(54) INSULATING FILM FORMATION METHOD, SEMICONDUCTOR DEVICE, AND PRODUCTION APPARATUS

(75) Inventors: Yukihiko Nakata, Nara (JP); Takashi Itoga, Nara (JP); Tetsuya Okamoto, Nara (JP); Toshimasa Hamada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/037,558

(22) Filed: Jan. 4, 2002

(65) Prior Publication Data

US 2002/0090776 A1 Jul. 11, 2002

(30) Foreign Application Priority Data

Jan. 9, 2001 (JP) .......................... 2001-001042

(51) Int. Cl.[7] .............................................. H01L 21/31
(52) U.S. Cl. ...................... 438/787; 438/770; 438/149; 438/486; 257/347
(58) Field of Search ............................ 438/787, 770, 438/163, 486, 587, 419, 149, 158, 315, 334; 257/347, 412, 638

(56) References Cited

U.S. PATENT DOCUMENTS

| | | | | |
|---|---|---|---|---|
| 5,510,158 A | * | 4/1996 | Hiramoto et al. ............... 216/66 |
| 5,932,492 A | * | 8/1999 | Hahm et al. ..................... 216/51 |
| 5,998,838 A | * | 12/1999 | Tanabe et al. ................... 257/347 |
| 6,124,216 A | * | 9/2000 | Ko et al. ......................... 438/761 |
| 6,235,615 B1 | * | 5/2001 | Dinh et al. ....................... 117/3 |
| 6,248,618 B1 | * | 6/2001 | Quek et al. ...................... 438/199 |
| 6,287,988 B1 | * | 9/2001 | Nagamine et al. .............. 438/765 |
| 6,310,367 B1 | * | 10/2001 | Yagishita et al. ............... 257/190 |
| 6,337,289 B1 | * | 1/2002 | Narwankar et al. ............ 438/776 |
| 6,342,421 B1 | * | 1/2002 | Mitani et al. ................... 438/199 |
| 6,348,420 B1 | * | 2/2002 | Raaijmakers et al. .......... 438/769 |
| 6,380,104 B1 | * | 4/2002 | Yu ................................... 438/775 |
| 2001/0010975 A1 | * | 8/2001 | Tanabe et al. ................... 438/770 |
| 2002/0009861 A1 | * | 1/2002 | Narwankar et al. ............ 438/404 |
| 2002/0011627 A1 | * | 1/2002 | Takemura et al. .............. 257/351 |

OTHER PUBLICATIONS

J. Zhang et al., Appl. Phys. Lett. 71 (20), Nov. 17, 1997, pp. 2964–2966.

* cited by examiner

*Primary Examiner*—Phat X. Cao
*Assistant Examiner*—Thao X. Le
(74) *Attorney, Agent, or Firm*—Edwards & Angell, LLP; David C. Conlin; David A. Tucker

(57) ABSTRACT

A method for forming an insulator film at a semiconductor temperature of 600° C. or less comprises the steps of forming a first insulator film by oxidizing a surface of a semiconductor in an atmosphere containing oxygen atom radicals, and forming a second insulator film on the first insulator film by deposition without exposing the first insulator film to outside air.

22 Claims, 15 Drawing Sheets

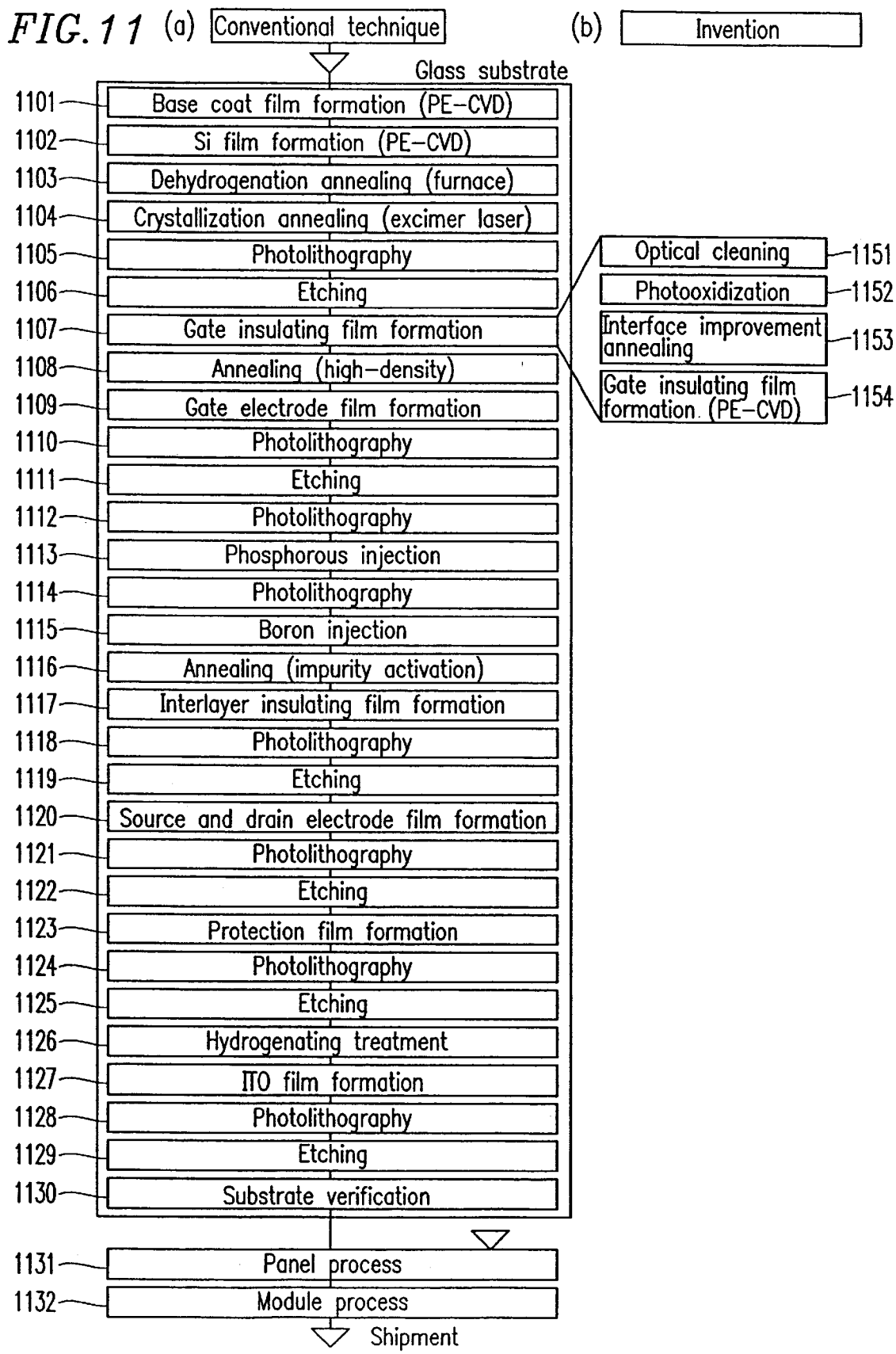
FIG. 11 (a) Conventional technique  (b) Invention

INSULATING FILM FORMATION METHOD, SEMICONDUCTOR DEVICE, AND PRODUCTION APPARATUS

BACKGROUND OF THE INVENTION

1. Field of the Invention

The present invention relates to a method for forming an insulator film on a semiconductor, where a combination of the semiconductor and the insulator film is used in a FET (Field Effect Transistor) or a polycrystal silicon thin film transistor which has a MOS (Metal Oxide Semiconductor) structure. The present invention also relates to a semiconductor device fabricated using the method, and a production apparatus.

2. Description of the Related Art

FETs are widely used for LSIs. To improve the performance of LSIs, there is a demand for a satisfactory thin insulator film which can be formed at a low temperature, and with satisfactory semiconductor-insulator film interfacial quality.

Conventionally, single-crystal silicon is generally thermally oxidized at a temperature of 700° C. to 1000° C. In thermal oxidation, an oxidation reaction develops from a surface of a semiconductor (a surface of a semiconductor layer) and progresses inward. Therefore, an interface is produced between the semiconductor layer (semiconductor) and an oxide silicon film (gate insulator film) provided by the thermal oxidation of the semiconductor layer surface, i.e., the interface is provided inside the original semiconductor layer. Therefore, the interface is not substantially affected by a condition of the original surface, so that a very satisfactory interface can be advantageously obtained. However, the high temperature process is likely to warp a silicon wafer. Low temperatures suppress warp, but cause an oxidation rate to be rapidly reduced. Thus, a low temperature process is not practical.

An insulator film may also be produced by plasma CVD (Chemical Vapor Deposition), but it is difficult to obtain satisfactory interfacial quality. In this case, the most critical problem is that ion damage due to plasma is inevitable.

On the other hand, the recent development of large-size, high-definition, and high-performance liquid crystal display apparatuses require higher and higher-density TFTs (Thin Film Transistors). There is an increasing demand for TFTs of a polysilicon (poly-Si) film in place of conventional amorphous silicon film TFTs. A gate insulator film, which is crucially important for TFT's performance and reliability, is provided by plasma CVD. However, when plasma CVD is employed to form a gate insulator film, damage due to plasma is inevitable. In this case, particularly, a threshold voltage of the resultant transistor cannot be controlled with high precision, and reliability of the transistor may be lowered.

As often the case in poly-Si TFTs, a $SiO_2$ film may be formed by plasma CVD using TEOS (Tetra Ethyl Ortho Silicate) and $O_2$ gases. Such a $SiO_2$ film contains carbon atoms which are originally contained in a gas material. Even if the film is formed at 350° C. or more, it is difficult to reduce the carbon concentration to $1.1 \times 10^{20}$ atoms/cm$^3$ or less. In particular, when the film-forming temperature is as low as about 200° C., the carbon concentration in the film is increased by an order of magnitude up to $1.1 \times 10^{21}$ atoms/cm$^3$. Therefore, it is difficult to reduce film-forming temperature.

In the case of plasma CVD using $SiH_4$ and $N_2O$-based gases, an interface nitrogen concentration is as great as one atom % or more, so that an interface fixed charge density cannot be $5 \times 10^{11}$ cm$^{-2}$ or less. A functional gate insulator film cannot be obtained.

For the purpose of reducing ion damage due to plasma CVD so as to obtain a high-quality insulator film, oxidation methods, such as for example ECR plasma CVD and oxygen plasma, have been developed. However, since plasma is generated in the vicinity of a surface of a semiconductor, it is difficult to fully avoid ion damage.

Cleaning apparatuses using a light source, such as for example a low-pressure mercury lamp and an excimer lamp, have already been brought into mass production.

A method in which light is used to oxidize silicon at a low temperature of 250° C. has been studied. In this method, however, a film formation rate is as slow as 0.3 nm/min. At present, it is practically difficult to form an entire gate insulator film (J. Zhang et al., A. P. L., 71(20), 1997, P2964).

Japanese Laid-Open Publication No. 4-326731 discloses an oxidation method which is carried out in an ozone-containing atmosphere. As described below, however, in this method, ozone is produced using light, and the ozone is decomposed using light to produce oxygen atom radicals, i.e., the method comprises two reaction steps. Therefore, the method is poorly efficient, resulting in a low oxidation rate.

As described above, in the case of deposition (plasma CVD, etc.), a thick insulator film can be quickly formed on a semiconductor, but a surface of the original semiconductor remains as an interface between the semiconductor and the insulator film (gate insulator film), and ion damage is inevitable. Therefore, since interface trap density is increased, it is not possible to obtain satisfactory device characteristics.

When an insulator film is formed on a semiconductor using an oxidation method (e.g., an oxygen plasma oxidation method), an oxidation reaction develops from a surface of a semiconductor to the inside, and an interface between a semiconductor layer (semiconductor) and the insulator film is formed inside the original semiconductor layer. Therefore, the interface is not substantially affected by a condition of the original surface, so that a very satisfactory interface can be advantageously obtained. However, the high temperature process is likely to warp a silicon wafer. Low temperatures suppress warp, but cause an oxidation rate to be rapidly reduced. Thus, a low temperature process cannot produce an insulator film at a practical rate.

SUMMARY OF THE INVENTION

According to an aspect of the present invention, a method for forming an insulator film at a semiconductor temperature of 600° C. or less comprises the steps of forming a first insulator film by oxidizing a surface of a semiconductor in an atmosphere containing oxygen atom radicals, and forming a second insulator film on the first insulator film by deposition without exposing the first insulator film to outside air.

In one embodiment of this invention, the first insulator film forming step comprises generating the oxygen atom radicals by irradiating an atmosphere containing an oxygen gas with light having a wavelength of 175 nm or less.

In one embodiment of this invention, the first insulator film forming step comprises generating the oxygen atom radicals by irradiating an atmosphere containing an oxygen gas with light having a wavelength of 172 nm, the light emitted from a xenon excimer lamp.

In one embodiment of this invention, the first insulator film forming step comprises generating the oxygen atom radicals by irradiating an atmosphere containing an oxygen gas having a partial pressure of 0.05 torr to 50 torr with light having a wavelength of 172 nm, the light emitted from a xenon excimer lamp.

In one embodiment of this invention, the method further comprises, prior to the first insulator film forming step, the step of cleaning the surface of the semiconductor by irradiating the surface of the semiconductor with light having a wavelength of 175 nm or less in an atmosphere having substantially no oxygen.

In one embodiment of this invention, the first insulator film forming step comprises generating the oxygen atom radicals by plasma CVD, wherein there is a predetermined distance or more between a plasma generating site and the surface of the semiconductor.

In one embodiment of this invention, the first insulator film forming step comprises forming the first insulator film where a temperature of the semiconductor is in the range from 100° C. to 500° C.

In one embodiment of this invention, the first insulator film forming step comprises forming the first insulator film where the formed first insulator film has a thickness in the range from 0.5 nm to 20 nm.

In one embodiment of this invention, the first insulator film forming step comprises mixing the atmosphere with a hydrogen or fluorine gas.

In one embodiment of this invention, the method further comprises performing thermal annealing at the temperature of the semiconductor or less of the first and second insulator film forming steps.

In one embodiment of this invention, the method further comprises subjecting the first insulator film to hydrogen plasma treatment at the temperature of the semiconductor or less of the first and second insulator film forming steps.

In one embodiment of this invention, the second insulator film forming step comprises depositing the second insulator film by plasma CVD.

In one embodiment of this invention, the second insulator film depositing step comprises performing the deposition where a temperature of the semiconductor is in the range from 100° C. to 400° C.

In one embodiment of this invention, the second insulator film depositing step comprises performing the deposition of the second insulator film using at least silane-based and nitrogen monoxide gases.

In one embodiment of this invention, the second insulator film forming step comprises depositing the second insulator film by photo CVD.

In one embodiment of this invention, the semiconductor is single-crystal silicon.

In one embodiment of this invention, the semiconductor is polycrystal silicon.

In one embodiment of this invention, the semiconductor is a silicon thin film of polycrystal silicon provided on a substrate of at least glass, metal foil, or resin.

According to another aspect of the present invention, a semiconductor device comprises an insulator film formed by the above-described method.

In one embodiment of this invention, the semiconductor device is a silicon thin film transistor.

According to another aspect of the present invention, a semiconductor device comprises a semiconductor comprising a silicon thin film provided on a substrate of glass, metal foil, or plastic, and an oxide film provided on a surface of the semiconductor. An interface between the silicon thin film and the oxide film has a fixed charge density of $1 \times 10^{11}$ cm$^{-2}$ or less, an interface trap density of $1 \times 10^{11}$ cm$^{-2}$ eV$^{-1}$ or less, and a nitrogen concentration of 1 atom % or less, and the silicon thin film has a carbon concentration of $1 \times 10^{20}$ atoms/cm$^3$ or less.

In one embodiment of this invention, the semiconductor device is a silicon thin film transistor.

According to another aspect of the present invention, an apparatus for forming an insulator film on a semiconductor comprises a first reaction chamber for forming a first insulator film by oxidizing a surface of a semiconductor in an atmosphere containing oxygen atom radicals, and a second reaction chamber for forming a second insulator film on the first insulator film by deposition.

In one embodiment of this invention, in the first reaction chamber, the surface of the semiconductor is oxidized with oxygen atom radicals generated by irradiating an atmosphere containing an oxygen gas with light having a wavelength of 175 nm or less.

In one embodiment of this invention, in the first reaction chamber, the surface of the semiconductor is oxidized with oxygen atom radicals generated by irradiating an atmosphere containing an oxygen gas with light having a wavelength of 172 nm, the light emitted from a xenon excimer lamp.

Thus, the invention described herein makes possible the advantages of providing: (1) a method for forming an insulator film by high-rate oxidation without plasma damage, whereby a satisfactory interface is provided between a semiconductor and the gate insulator film, and a thick insulator film can be quickly and practically obtained; (2) a semiconductor device produced by the method; and (3) a production apparatus.

These and other advantages of the present invention will become apparent to those skilled in the art upon reading and understanding the following detailed description with reference to the accompanying figures.

BRIEF DESCRIPTION OF THE DRAWINGS

FIG. 11 is a diagram showing a process flow when the present invention is applied to production of a polycrystal silicon thin film transistor on a glass substrate.

DESCRIPTION OF THE PREFERRED EMBODIMENTS

Hereinafter, the present invention will be described by way of illustrative examples with reference to the accompanying drawings.

EXAMPLE 1

Figure 1A:
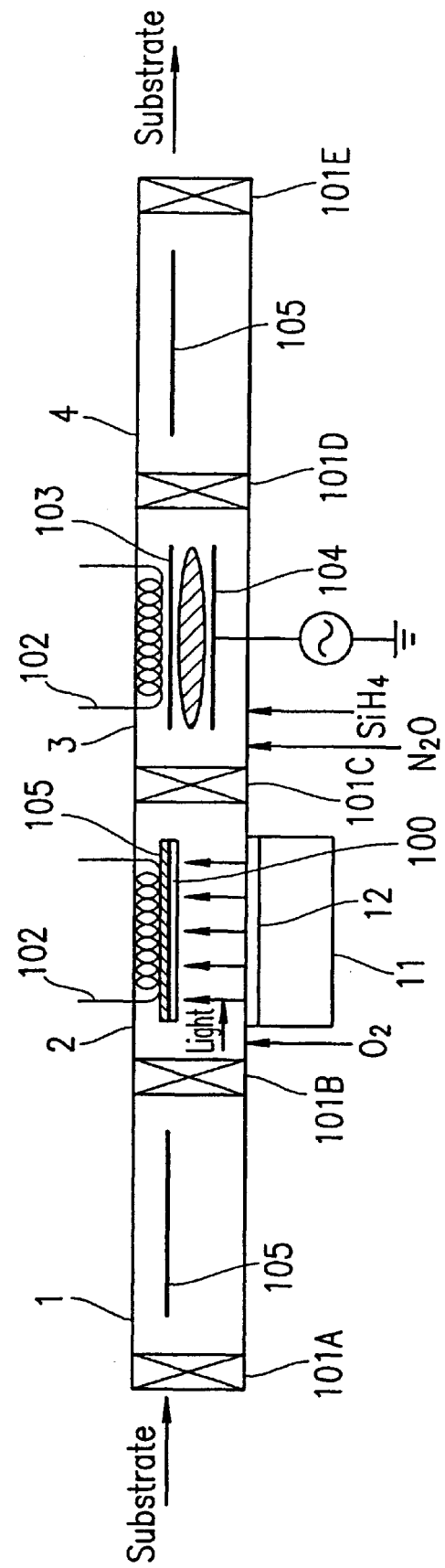
FIG. 1A is a diagram showing an apparatus for producing an insulator film according to an example of the present invention.

FIG. 1A is a schematic diagram showing a production apparatus 50 according to Example 1 of the present invention. In the production apparatus 50, two insulator films (a photo-oxidation film and a deposition film) were continuously produced without interruption of a vacuum. The production apparatus 50 functions as a production apparatus for producing an insulator film and, more specifically, a single type optical·plasma CVD apparatus.

The apparatus 50 comprised: a load chamber 1; an optical cleaning/photo-oxidation chamber 2 (first reaction chamber) in which oxidation was carried out using light; a hydrogen plasma/film formation chamber 3 (second reaction chamber); and an unload chamber 4.

A 6 inch-diameter p-type substrate 100 having a (100) plane and a specific resistance of 10 to 15 Ωcm was cleaned and thereafter loaded into the load chamber 1 through the gate valve 101A.

In this example, the substrate 100 is made of a single-crystal silicon. After evacuated to form a vacuum ($3 \times 10^{-1}$ Pa), a gate valve 101B was opened. The substrate 100 was transferred to the optical cleaning/photo-oxidation chamber 2 having a capacity of 80000 $cm^3$. The gate valve 101B was closed.

The substrate 100 was placed on a substrate support 105 which had been heated by a heater 102 to 350° C. A surface of the substrate 100 was irradiated with 172 nm-wavelength light from a xenon excimer lamp 11 through a synthesized quartz window 12. The xenon excimer lamp 11 is placed outside the optical cleaning/photo-oxidation chamber 2. The light intensity of the irradiation was 60 mW/$cm^2$ immediately after the synthesized quartz window 12 and 11 mW/$cm^2$ at the substrate surface. A distance from the window 12 to the substrate 100 was constantly 25 mm.

2 to 3-minute light irradiation decomposed organic substances attached to the silicon surface (the (100) plane of the substrate 100), i.e., optical cleaning. In such optical cleaning, supply of a fluorine or hydrogen gas flow would produce a satisfactory cleaning effect which is highly reproducible. The reason is considered to be that on the cleansed surface, dangling bonds of silicon atoms are projected from a semiconductor surface (silicon surface), and these dangling bond were terminated with a fluorine or hydrogen gas, thereby securing the reproducibility of a surface state.

Thereafter, while the substrate temperature was maintained at 350° C., an oxygen gas was introduced into the optical cleaning/photo-oxidation chamber 2 at a flow rate of 50 sccm. An internal pressure was held at 5 torr. Using 172 nm-wavelength irradiation by a xenon excimer lamp, oxygen molecules were directly and efficiently decomposed into highly reactive oxygen atom radicals as indicated in equation (1) below. The oxygen atom radicals oxidized the (100) plane of the substrate 100. Three-minute photo-oxidation produced a 4.3 nm-thick oxide film (photo-oxidation layer) which was a first insulator film (not shown).

After a gate valve 101C was opened, the substrate 100 was transferred to the hydrogen plasma/film formation chamber 3 comprising parallel-plate electrodes 110, i.e., an anode electrode 104 and a cathode electrode 103. An $SiO_2$ film (not shown) which was a second insulator film was formed by plasma CVD which was one of deposition methods under the following conditions: the substrate temperature was 350° C.; a $SiH_4$ gas as a material gas was supplied at a flow rate of 5 sccm; a $N_2O$ gas was supplied at a flow rate of 1000 sccm; the gas pressure was 1.3 torr; and an RF source power was 450 w. Three-minute deposition produced a 97 nm thick second insulator film.

Thereafter, after a gate valve 101D was opened, the substrate 100 was transferred to the unload chamber 4. Finally, the substrate 100 was removed from the unload chamber 4.

Figure 1B:
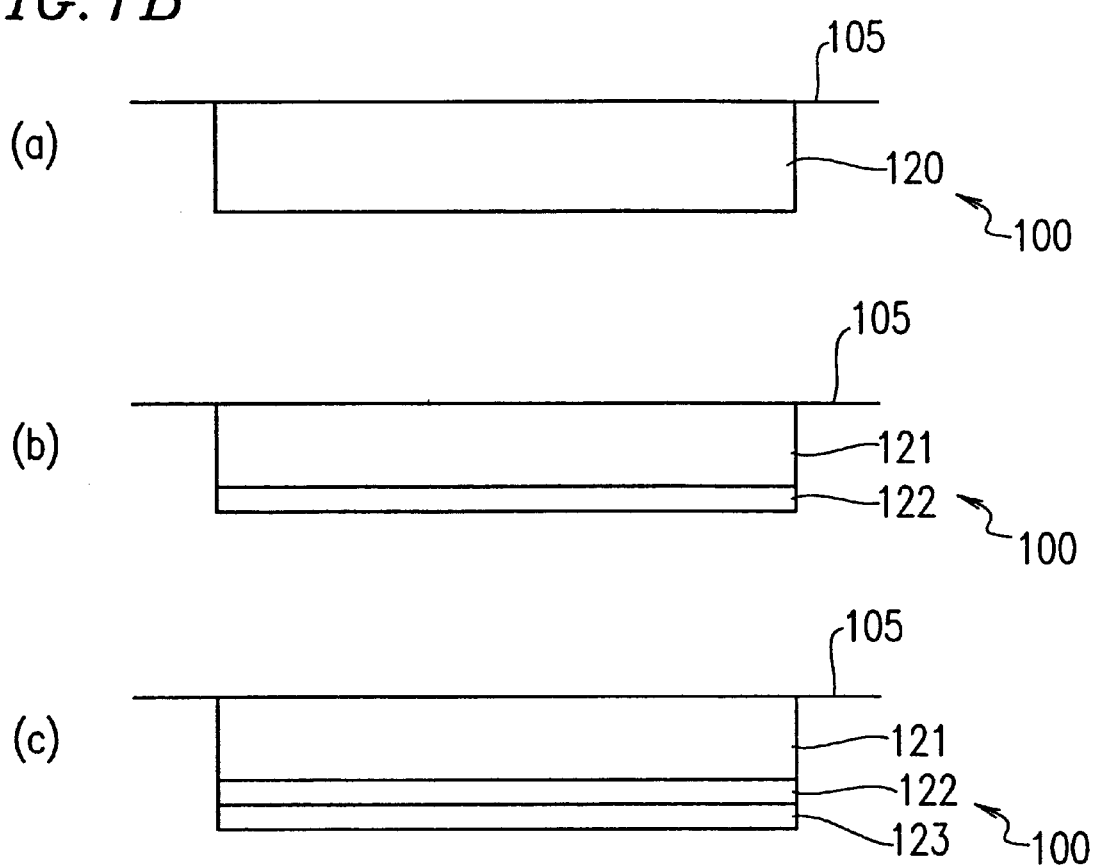
FIG. 1B is a diagram showing a flow of production of two insulator films of different types.

FIG. 1B is a diagram showing a flow of production of two insulator films of different types.

The substrate 100 is fixed on the substrate support 105 (FIG. 1B(*a*)). In this example, the substrate 100 is a semiconductor 120.

Preferably, the substrate 100 is subjected to optical cleaning in the optical cleaning/photo-oxidation chamber 2.

Thereafter, the substrate 100 is subjected to photo-oxidation in the optical cleaning/photo-oxidation chamber 2 (FIG. 1B(*a*)). The photo-oxidation substrate 100 comprises a semiconductor 121 and a photo-oxidation film 122, where the photo-oxidation film 122 is an insulator film. Such an insulator film is herein called a first insulator film.

Thereafter, a deposition film 123 is deposited on the photo-oxidation film 122 (FIG. 1B(*c*)). The substrate 100 comprises the semiconductor 121, the photo-oxidation film 122, and the deposition film 123, where the deposition film 123 is an insulator film. Such an insulator film is herein called a second insulator film.

Thereafter, an aluminum film was formed on the $SiO_2$ film provided on the (100) plane of the substrate 100, by sputtering. A number of 0.8 nm-diameter dots of the aluminum film were formed by photolithography. The resultant substrate 100 was used as a specimen to be measured on electric capacitance, i.e., capacitance-voltage characteristics.

As a result, the interface fixed charge density was $1 \times 10^{11}$ $cm^{-2}$ which was substantially the same as that of a thermal oxidation film (an $SiO_2$ film formed on the (100) plane of the substrate 100 by thermal oxidation). The interface fixed charge density of $1 \times 10^{11}$ $cm^{-2}$ was much improved from the interface fixed charge density $5 \times 10^{11}$ $cm^{-2}$ which is a value of an interface between a single-crystal silicon and a silicon dioxide film which is formed on the (100) plane of the substrate 100 by plasma CVD using $SiH_4$ and $N_2O$-based gases without providing a 4.3 nm-thick oxide silicon film ($SiO_2$ film) as a first insulator film.

Figure 2:
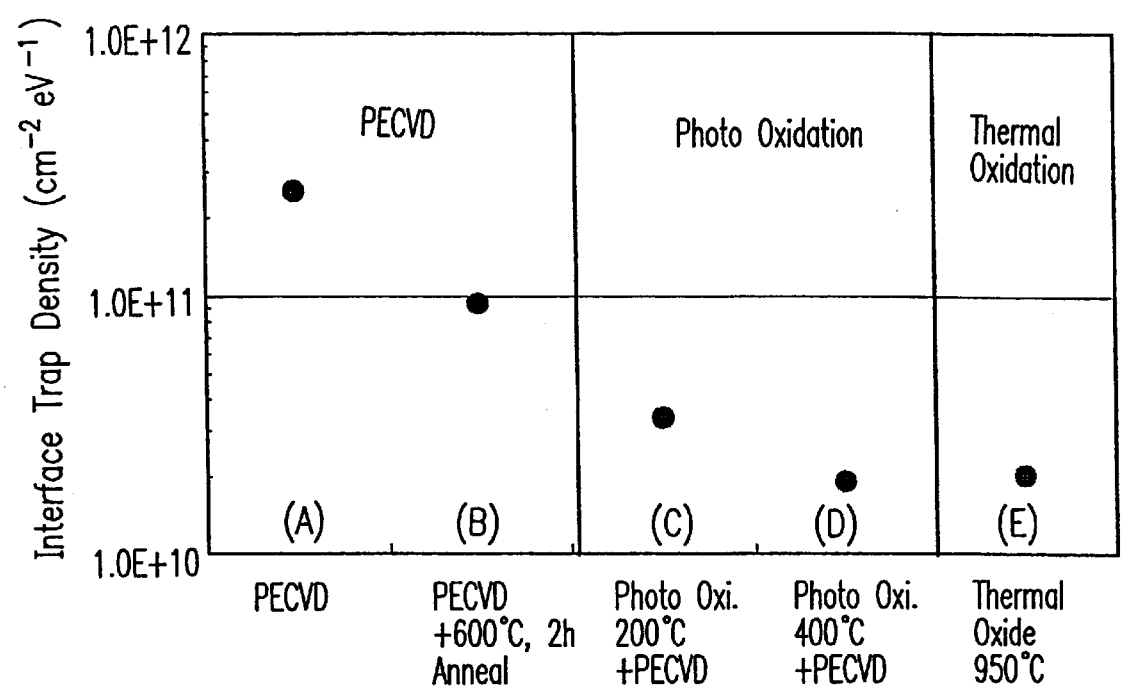
FIG. 2 is a graph showing an interface trap density in the present invention and a comparative example.

FIG. 2 is a graph showing an interface trap density in the present invention and a comparative example.

FIG. 2(A) shows an interface trap density of a substrate comprising an insulator film ($SiO_2$ film) having a film thickness of about 100 nm formed by plasma CVD in a comparative example.

FIG. 2(B) shows an interface trap density of a substrate comprising an insulator film ($SiO_2$ film) having a film thickness of about 100 nm formed by plasma CVD followed by annealing at 600° C. for 2 hours in a comparative example.

FIG. 2(C) shows an interface trap density of a substrate comprising a photo-oxidation film having a film thickness of 4.3 nm formed by photo-oxidation at 200° C. and a second insulator film ($SiO_2$ film) having a film thickness of 97 nm formed by plasma CVD after the formation of the photo-oxidation film in the present invention.

FIG. 2(D) shows an interface trap density of a substrate comprising a photo-oxidation film having a film thickness of 4.3 nm formed by photo-oxidation at 400° C. and a second insulator film ($SiO_2$ film) having a film thickness of 97 nm formed by plasma CVD after the formation of the photo-oxidation film in the present invention.

FIG. 2(E) shows an interface trap density of a substrate comprising a thermal oxidation film having a film thickness of about 100 nm formed by thermal oxidation at 950° C. in a comparative example.

As shown in FIG. 2(C), an interface trap density of a substrate comprising a 4.3 nm-thick photo-oxidation film formed by photo-oxidation at 200° C. and a 97 nm-thick second insulator film ($SiO_2$ film) formed by plasma CVD after the formation of the photo-oxidation film, is $3 \times 10^{10}$ $cm^{-2}$ $eV^{-1}$. As shown in FIG. 2(D), an interface trap density of a substrate comprising a 4.3 nm-thick photo-oxidation film formed by photo-oxidation at 400° C. and a 97 nm-thick second insulator film ($SiO_2$ film) formed by plasma CVD after the formation of the photo-oxidation film, is $2 \times 10^{10}$ $cm^{-2}$ $eV^{-1}$. The above-described interface trap densities are substantially equal to an interface trap density ($2 \times 10^{10}$ $cm^{-2}$ $eV^{-1}$) of a substrate comprising an about 100 nm-thick thermal oxidation film formed by thermal oxidation at 950° C. as shown in FIG. 2(E).

Further, as shown in FIG. 2(A), an interface trap density of a substrate comprising an about 100 nm-thick second insulator film ($SiO_2$ film) formed by plasma CVD using $SiH_4$ and $N_2O$-based gasses without a 4.3 nm-thick $SiO_2$ film (first insulator film) formed by photo-oxidation, is $2.5 \times 10^{10}$ $cm^{-2}$ $eV^{-1}$. Even if such a substrate is annealed at 600° C. for 2 hours, its interface trap density is $9 \times 10^{10}$ $cm^{-2}$ $eV^{-1}$ as shown in FIG. 2(B). Thus, by providing a photo-oxidation film at an interface between a semiconductor and an insulator film, the property of the interface is significantly improved.

Figure 3A:
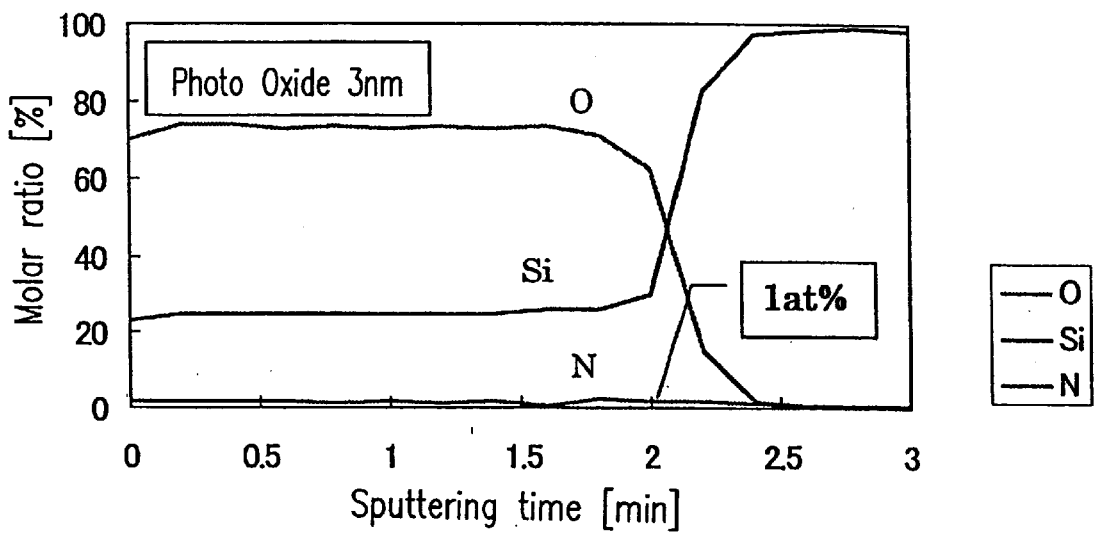
FIG. 3A is a graph showing a molar ratio by Auger analysis in the vicinity of an interface in an example of the present invention.
Figure 3B:
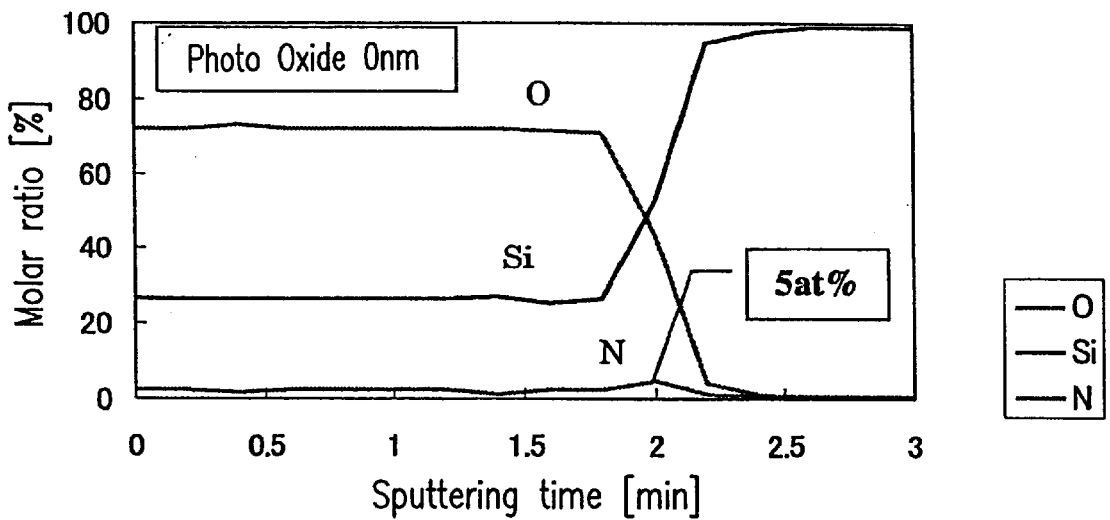
FIG. 3B is a graph showing a molar ratio by Auger analysis in the vicinity of an interface in a comparative example.

FIG. 3A is a graph showing a molar ratio by Auger analysis in the vicinity of an interface in an example of the present invention. FIG. 3B is a graph showing a molar ratio by Auger analysis in the vicinity of an interface in a comparative example.

As shown in FIG. 3A, an interface between the single-crystal silicon and the silicon dioxide film (first insulator film) by photo-oxidation, and an interface between the oxide silicon film (first insulator film) by photo-oxidation and the oxide silicon film (second insulator film) by plasma CVD, each had a nitrogen concentration of 1 atom % or less.

As shown in FIG. 3B as a comparative example, this value is much improved from 5 atom % which is obtained when an oxide silicon film is directly formed on the (100) plane of the substrate 100 by plasma CVD using $SiH_4$ and $N_2O$-based gases.

When silicon (Si) is oxidized, Si is changed to $SiO_2$. In this case, the volume is doubled. Therefore, a transition layer from Si to $SiO_2$ emerges. It is believed that if nitrogen atoms are present during formation of such a transition layer, the interface portion takes up a considerably large number of nitrogen atoms, so that an amount of fixed charge is increased in the interface. Therefore, it is considered that by forming the transition layer in atmosphere without nitrogen, the amount of nitrogen in the interface could be reduced.

Thereafter, the reliability of film properties was assessed by subjecting a specimen to be measured on its electrical capacitance to stress testing in the presence of an applied electric field of ±2 MV/cm at 150° C. for 30 minutes.

For the purpose of comparison, in the case of a $SiO_2$ film provided on the (100) plane of the substrate by PE-CVD (plasma CVD) without a photo-oxidation layer, a flat band voltage was −2.5 V as an initial value, −2.5 V in the presence of applied positive voltage, and −4.2 V in the presence of applied negative voltage. In contrast, in the case of the film of the present invention, a flat band voltage was −0.8 V as an initial value, −0.8 V in the presence of applied positive voltage, and −1.2 V in the presence of applied negative voltage. Therefore, there were little variations in the substrate of the present invention before and after testing and the reliability was improved.

Further, the carbon concentration of the $SiO_2$ film was measured by SIMS (Secondary Ion Mass Spectroscopy). The $SiO_2$ film formed by plasma CVD using $SiH_4$ and $N_2O$-based gases, and a $SiO_2$ film formed by photo-oxidation according to the present invention, each had a carbon concentration of $1 \times 10^{19}$ atoms/$cm^3$ or less.

As a comparative example, in the case of the $SiO_2$ film formed by plasma CVD using TEOS and $O_2$ gases, even when the film formation was conducted at 350° C. or more, it was difficult to achieve a carbon concentration of $1.1 \times 10^{20}$ atoms/$cm^3$ or less. When the film formation was conducted at 200° C., the carbon concentration was $1.2 \times 10^{21}$ atoms/$cm^3$. As compared to the comparative example, the carbon concentration could be reduced by an order of magnitude in the example of the present invention.

In the case of the example using light of the xenon excimer lamp 11 in the optical cleaning/photo-oxidation chamber 2, as indicated equation (1), oxygen atom radicals O($^1$D) can be efficiently produced directly from oxygen molecules. The oxygen atom radicals O($^1$D) oxidize a semiconductor surface (the (100) plane of the substrate 100). Thus, when a xenon excimer lamp is employed, ozone is not involved in the reaction.

When a low-pressure mercury lamp is employed, as indicated in equation (2), 185-nm light produces ozone from oxygen molecules, and the ozone is changed to an oxygen atom radical O($^1$D) by 254-nm light, i.e., two reaction steps.

A xenon excimer lamp causes a single step reaction. Therefore, a xenon excimer lamp produces oxygen atom radicals O($^1$D) more efficiently than a low-pressure mercury lamp, resulting in a higher oxidation rate. Note that the reaction represented by equation (1) occurs when 175 nm or less wavelength light is used.

Xenon excimer lamp

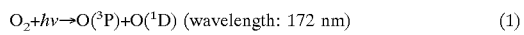

$$O_2 + h\nu \rightarrow O(^3P) + O(^1D) \text{ (wavelength: 172 nm)} \quad (1)$$

Low-pressure mercury lamp

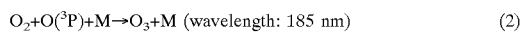

$$O_2 + O(^3P) + M \rightarrow O_3 + M \text{ (wavelength: 185 nm)} \quad (2)$$

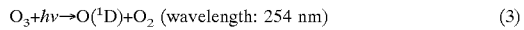

$$O_3 + h\nu \rightarrow O(^1D) + O_2 \text{ (wavelength: 254 nm)} \quad (3)$$

O($^3$P): $^3$P is an oxygen atom in an excited state
O($^1$D): $^1$D is an oxygen atom in another excited state
M: oxygen compound gas other than $O_2$, O($^3$P), and $O_3$
h: Plank's constant
v: frequency of light In Example 1, as a method for producing oxygen atom radicals, an oxygen gas was irradiated with light.

However, oxygen atom radicals can be produced at a distance of 3 cm or more from a semiconductor using plasma generated by microwave, ECR, or the like, in order to avoid ion bombardment. Plasma generated a distance of 3 cm or more away from a semiconductor is herein called "remote plasma".

Next, oxygen gas pressure and substrate temperature were studied in order to increase an oxidation rate.

The optical absorption coefficient of an oxygen gas is $2 \times 10^1$ atm$^{-1}$ cm$^{-1}$ for 172 nm wavelength light, and $1 \times 10^{-1}$ atm$^{-1}$ cm$^{-1}$ for 185 nm wavelength light, i.e., the latter value is about 200 times as much as the former value. Thus, 172 nm wavelength light produces oxygen atom radicals directly or more efficiently, i.e., a larger amount of light is absorbed.

When oxygen gas pressure is excessively high, for example 1 atmospheric pressure, light is absorbed within 3 mm from the light introduction window 12. Therefore, oxygen atom radicals are generated in the vicinity of the light introduction window 12 which is far away from a semiconductor surface. Conversely, when oxygen gas pressure is excessively low, not much light is absorbed and less oxygen atom radicals are generated. Therefore, optimum oxygen gas pressure needs to be found in order to increase a photo-oxidation rate by producing oxygen atom radicals in the vicinity of a semiconductor surface.

Figure 4:
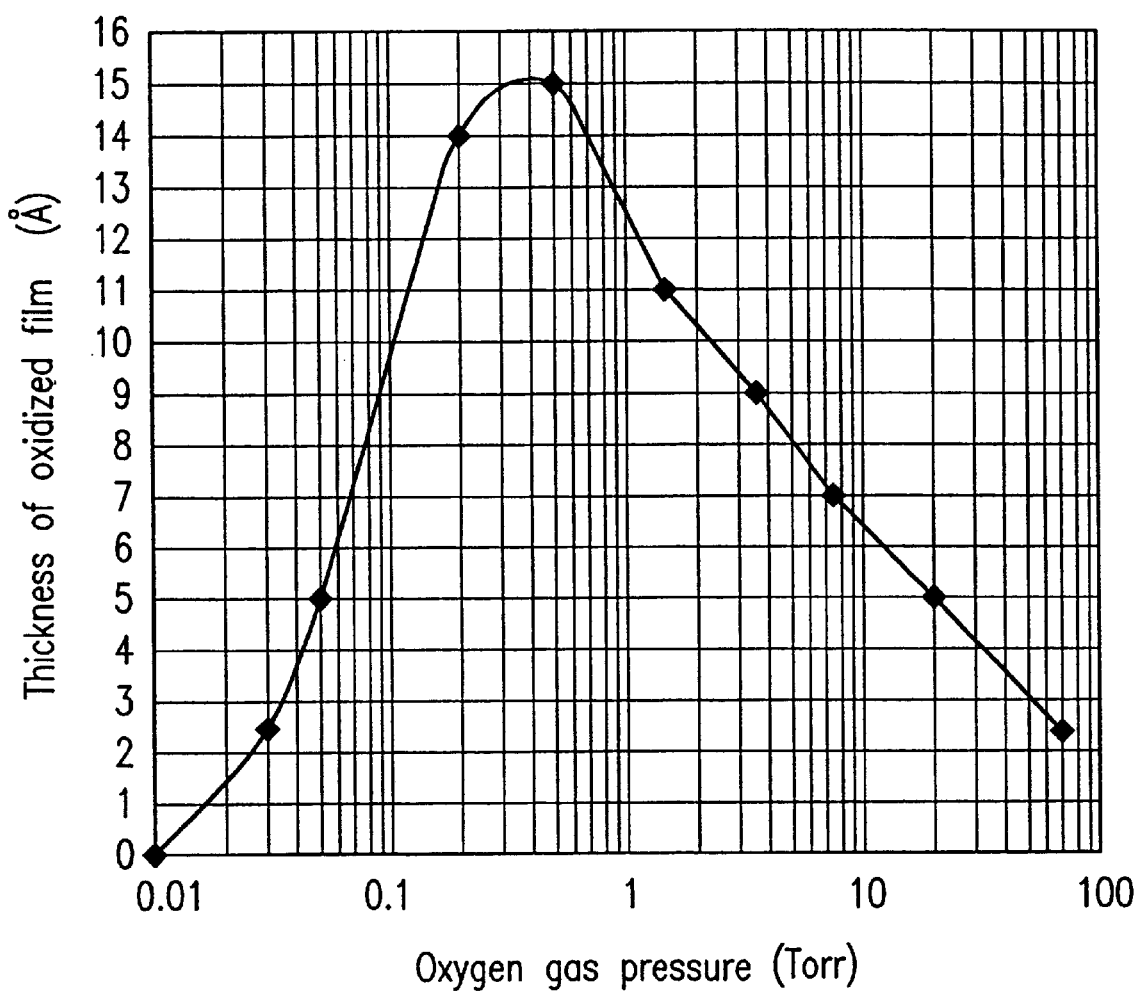
FIG. 4 is a graph showing a relationship between oxygen gas pressure and a film thickness of a photo-oxidation film ($SiO_2$ film).

FIG. 4 shows a relationship between oxygen gas pressure and a thickness of an oxide film when oxidation was conducted using 172-nm light at a substrate temperature of 300° C. for 30 minutes.

Data was collected under conditions that there was a distance of 25 nm from the light introduction window 12 to the substrate 100 and the temperature was 350° C. The data was in agreement with theoretical values to a large extent. Therefore, in order to improve the oxidation rate, the partial pressure of oxygen gas is preferably in the range from 0.05 torr to 50 torr, though the optimum value varies depending on the distance from the light introduction window 12 to the film surface (100) of the substrate 100.

Oxidation proceeds in the following two modes: "reaction rate-determining step mode" and "diffusion rate-determining step mode". In the reaction rate-determining step mode, an oxidation rate is determined by a reaction rate of silicon with oxygen. In the diffusion rate-determining step mode, an oxidation rate is determined by a time required for oxidation seeds diffused in a film oxide silicon film to reach an interface between an oxide silicon film (SiO$_2$ film) and silicon (Si). As the substrate temperature is increased, the reaction rate of silicon with oxygen increases. In this case, a diffusion rate of the oxidation seeds in the oxidized film is particularly increased. Therefore, the higher the substrate temperature, the higher the oxidation rate.

Figure 5:
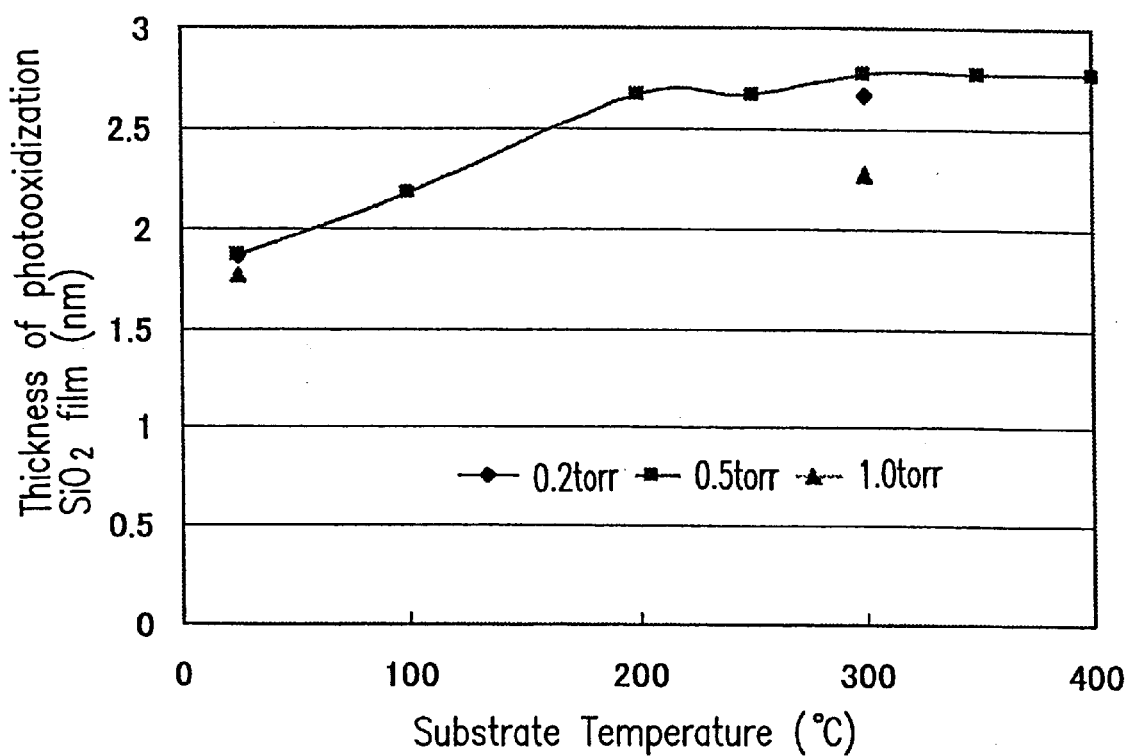
FIG. 5 is a graph showing a relationship between substrate temperature and a film thickness of a photo-oxidation film.

FIG. 5 shows a relationship between the substrate temperature and a film thickness of a photo-oxidation layer as a result of 30-minute oxidation, where the oxygen gas pressures are 0.2, 0.5, and 1 torr. The film thickness of a photo-oxidation layer is increased with an increase in the chamber temperature from room temperature to 200° C. From 200° C. to 400° C., the photo-oxidation rate is substantially steady.

Figure 6:
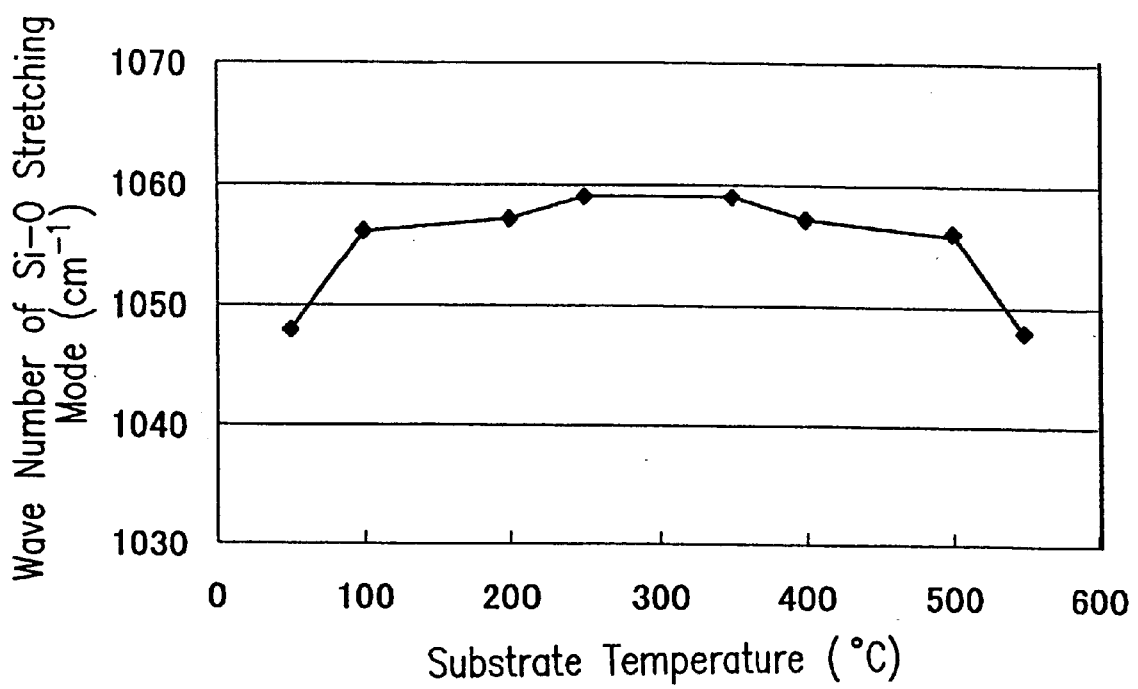
FIG. 6 is a graph showing substrate temperature versus a wave number of infrared absorption due to Si—O bonds measured by Fourier transform infrared spectroscopy.

FIG. 6 shows the wave number of infrared light absorbed by a Si—O bond measured by Fourier transform infrared spectroscopy. As can be seen from FIG. 6, the greater the wave number, the better the film quality. The film quality decreases in the range of 100° C. or less and 500° C. or more.

Thus, the semiconductor temperature for photo-oxidation is, for example, 600° C. or less, preferably in the range from 100° C. to 500° C., more preferably 200° C. to 350° C., taking into consideration an influence of photo-oxidation on an apparatus and a substrate.

In Example 1, the semiconductor temperature was 350° C.

The thickness of a photo-oxidation film was changed from 0.5 nm to 20 nm at a substrate temperature of 350° C. The thickness of an overall oxidation film containing the photo-oxidation film and a plasma CVD film was designed to be about 100 nm. In this case, the interface fixed charge was measured. The interface fixed charge was $3 \times 10^{11}$ cm$^{-2}$ when the photo-oxidation layer was 0.5 nm thick, $1 \times 10^{11}$ cm$^{-2}$ when the photo-oxidation layer was 3 nm thick, and $7 \times 10^{10}$ cm$^{-2}$ when the photo-oxidation layer was 3 nm thick, as compared with $5 \times 10^{11}$ cm$^{-2}$ when a photo-oxidation layer is not provided in the comparative example.

Thus, the photo-oxidation layer of as small as 0.5 nm thick had an effect, and the effect of the photo-oxidation layer is substantially saturated at about 20 nm thick. A film thickness at which the saturation begins corresponds to 20 nm which is a film thickness of a transition layer calculated based on nitrogen distribution as a result of Auger analysis for the above-described SiO$_2$ film of SiH$_4$ and N$_2$O gases. The 20 nm-thick specimen was produced by irradiating the specimen for 5 hours by another xenon excimer lamp having a light intensity of 50 mW/cm$^2$.

Figure 7:
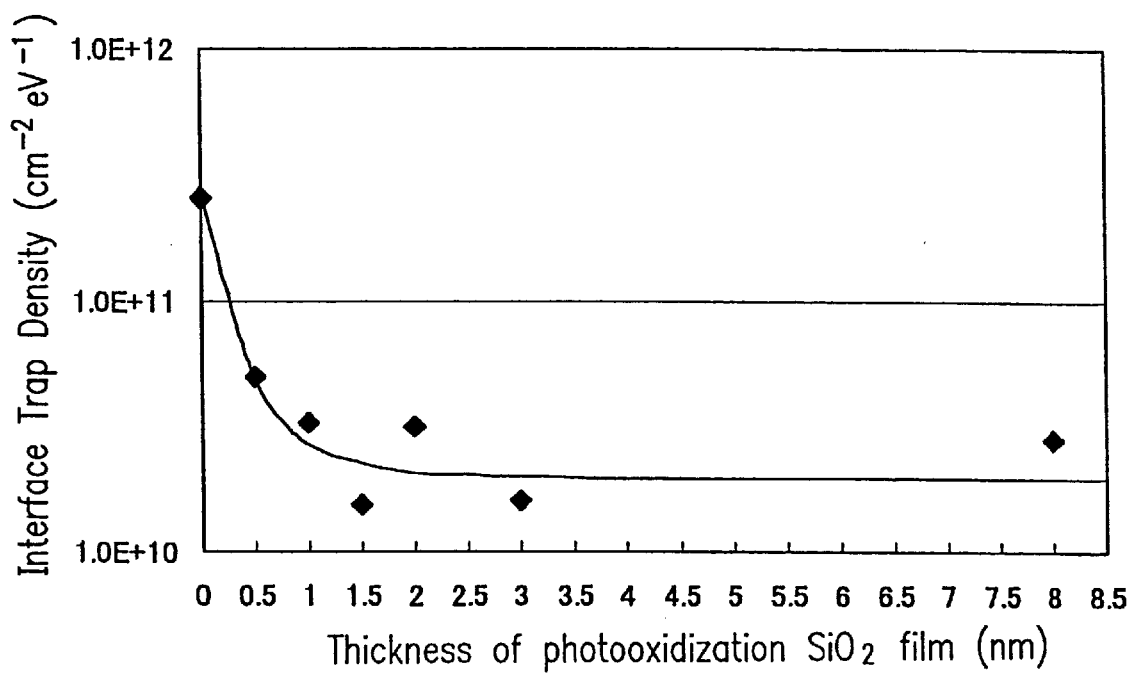
FIG. 7 is a graph showing a relationship between a film thickness of a photo-oxidation film ($SiO_2$ film) used as an insulator film according to the present invention, and interface trap density.

FIG. 7 shows a relationship between a film thickness of a photo-oxidation layer and an interface trap density. When the photo-oxidation layer is 0.5 nm thick, the interface trap density is decreased. Therefore, the film thickness of a photo-oxidation layer is preferably in the range from 0.5 nm to 20 nm.

Figure 8:
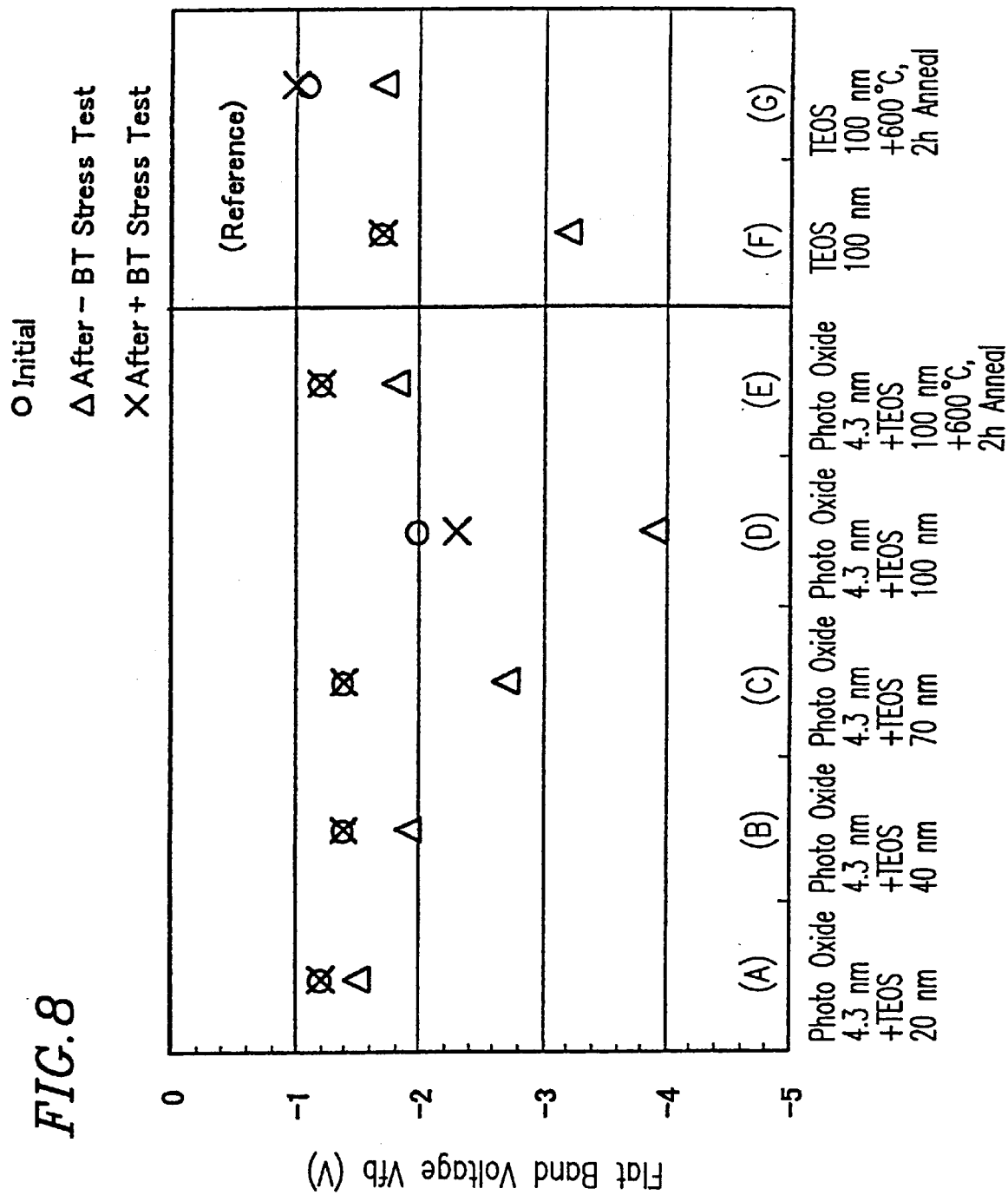
FIG. 8 is a graph showing a relationship between a film thickness of a second insulator film and a flat band voltage (Vfb), in which the second insulator film is a PECVD (TEOS+$O_2$) film ($SiO_2$ film produced by plasma CVD using TEOS and $O_2$ gases) provided on a photo-oxidation film ($SiO_2$ film) which is used as the insulator film of the present invention, or provided on the semiconductor according to a comparative example, and also showing results of a reliability test (±BT test bias voltage·temperature test).

FIG. 8 shows a relationship between a film thickness of the second insulator film and a flat band voltage (Vfb) and results of a reliability test where a second insulator film (SiO$_2$ film) was formed on a photo-oxidation layer (SiO$_2$ film) having a film thickness of 4.3 nm by plasma CVD using TEOS and $O_2$ gases.

In the reliability test (±BT test: bias voltage temperature test), a change in Vfb was measured by conducing electrolysis in the presence of an applied voltage of ±2 MV/cm to an insulator film at 150° C. for 30 minutes.

FIG. 8(A) shows a flat band voltage of a substrate of the present invention on which a photo-oxidation film having a film thickness of 4.3 nm was formed and thereafter a second insulator film ($SiO_2$ film) having a film thickness of 20 nm was formed by plasma CVD using TEOS and $O_2$ gases.

FIG. 8(B) shows a flat band voltage of a substrate of the present invention on which a photo-oxidation film having a film thickness of 4.3 nm was formed and thereafter a second insulator film ($SiO_2$ film) having a film thickness of 40 nm was formed by plasma CVD using TEOS and $O_2$ gases.

FIG. 8(C) shows a flat band voltage of a substrate of the present invention on which a photo-oxidation film having a film thickness of 4.3 nm was formed and thereafter a second insulator film ($SiO_2$ film) having a film thickness of 70 nm was formed by plasma CVD using TEOS and $O_2$ gases.

FIG. 8(D) shows a flat band voltage of a substrate of the present invention on which a photo-oxidation film having a film thickness of 4.3 nm was formed and thereafter a second insulator film ($SiO_2$ film) having a film thickness of 100 nm was formed by plasma CVD using TEOS and $O_2$ gases.

FIG. 8(E) shows a flat band voltage of a substrate of the present invention on which a photo-oxidation film having a film thickness of 4.3 nm was formed and thereafter a second insulator film ($SiO_2$ film) having a film thickness of 97 nm was formed by plasma CVD using TEOS and $O_2$ gases, followed by annealing for two hours at 600° C.

FIG. 8(F) shows a flat band voltage of a substrate of a comparative example on which an oxidation film having a film thickness of 100 nm was formed by plasma CVD using TEOS and $O_2$ gases.

FIG. 8(G) shows a flat band voltage of a substrate of a comparative example on which an oxidation film having a film thickness of 100 nm was formed by plasma CVD using TEOS and $O_2$ gases, followed by annealing for two hours at 600° C.

In FIGS. 8(A) through 8(G), ○ represents an initial voltage, Δ represents a voltage after −BT stress testing, and X represents a voltage after +BT stress testing.

Vfb reflects charge (e.g., interface fixed charge) of a film. The lesser the absolute value of Vfb, the more the film quality. In plasma CVD, the smaller the film thickness of a film formed using TEOS and $O_2$ gases, the smaller the |Vfb|, as in typical cases.

As shown in FIG. 8(B), in the case of a substrate comprising a photo-oxidation film ($SiO_2$ film) having a thickness of 4.3 nm and a PECVD (TEOS+$O_2$) film ($SiO_2$ film produced by plasma CVD using TEOS and $O_2$ gases) having a thickness of 40 nm, Vfb=−1.3 V and ΔVfb (−a variation in Vfb between before and after the BT test)=−0.6 V were obtained. These values are close to Vfb=−1.3 V and ΔVfb (−a variation in Vfb between before and after the BT test)=−0.6 V in the case of a PE CVD (TEOS+$O_2$) film (100 nm thick) without a photo-oxidation layer which was annealed at 600° C. for two hours as shown in FIG. 8(G).

Figure 9:
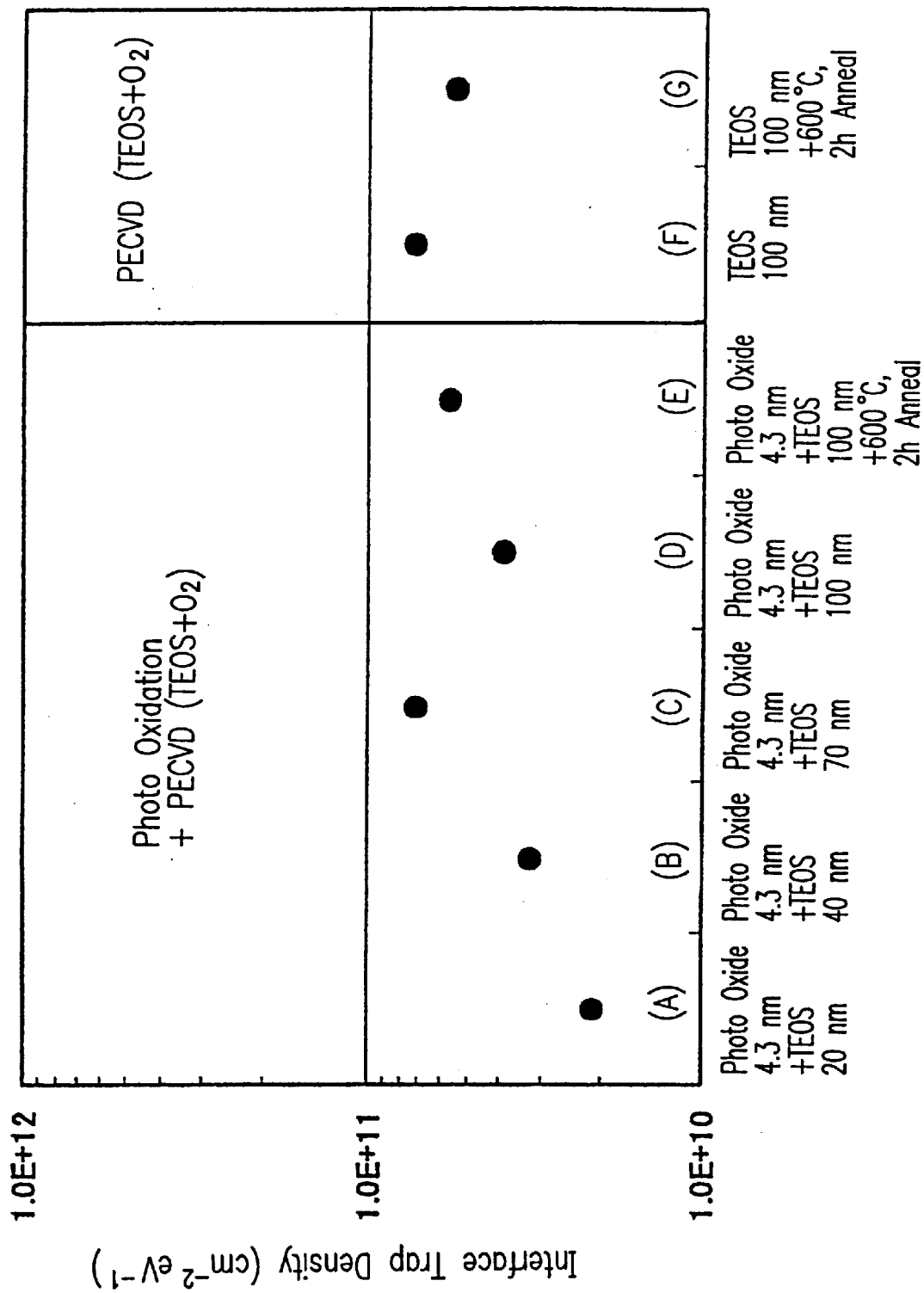
FIG. 9 is a graph showing a relationship between a film thickness of a second insulator film and interface trap density, where the second insulator film is a PECVD (TEOS+$O_2$) film ($SiO_2$ film produced by plasma CVD using TEOS and $O_2$ gases) provided on a photo-oxidation film (first insulator film) which is used as the insulator film of the present invention, or provided on the semiconductor according to a comparative example.

FIG. 9 is a graph showing a relationship between a film thickness of a second insulator film and interface trap density, where the second insulator film is a PECVD (TEOS+$O_2$) film ($SiO_2$ film produced by plasma CVD using TEOS and $O_2$ gases) provided on a photo-oxidation film (first insulator film) which is used as the insulator film of the present invention, or provided on the semiconductor according to a comparative example.

FIG. 9(A) shows an interface trap density of a substrate of the present invention on which a photo-oxidation film having a film thickness of 4.3 nm was formed and thereafter a second insulator film ($SiO_2$ film) having a film thickness of 20 nm was formed by plasma CVD using TEOS and $O_2$ gases.

FIG. 9(B) shows an interface trap density of a substrate of the present invention on which a photo-oxidation film having a film thickness of 4.3 nm was formed and thereafter a second insulator film ($SiO_2$ film) having a film thickness of 40 nm was formed by plasma CVD using TEOS and $O_2$ gases.

FIG. 9(C) shows an interface trap density of a substrate of the present invention on which a photo-oxidation film having a film thickness of 4.3 nm was formed and thereafter a second insulator film ($SiO_2$ film) having a film thickness of 70 nm was formed by plasma CVD using TEOS and $O_2$ gases.

FIG. 9(D) shows an interface trap density of a substrate of the present invention on which a photo-oxidation film having a film thickness of 4.3 nm was formed and thereafter a second insulator film ($SiO_2$ film) having a film thickness of 100 nm was formed by plasma CVD using TEOS and $O_2$ gases.

FIG. 9(E) shows an interface trap density of a substrate of the present invention on which a photo-oxidation film having a film thickness of 4.3 nm was formed and thereafter a second insulator film ($SiO_2$ film) having a film thickness of 97 nm was formed by plasma CVD using TEOS and $O_2$ gases, followed by annealing for two hours at 600° C.

FIG. 9(F) shows an interface trap density of a substrate of a comparative example on which an oxidation film having a film thickness of 100 nm was formed by plasma CVD using TEOS and $O_2$ gases.

FIG. 9(G) shows an interface trap density of a substrate of a comparative example on which an oxidation film having a film thickness of 100 nm was formed by plasma CVD using TEOS and $O_2$ gases, followed by annealing for two hours at 600° C.

The substrates of FIGS. 9(A) through 9(G) correspond to the respective substrates of FIGS. 8(A) through 8(G).

As shown in FIG. 9(A), a substrate comprising a photo-oxidation layer having a film thickness of 4.3 nm and a PE CVD (TEOS+$O_2$) film having a film thickness of 20 nm had an interface trap density of $2\times10^{10}$ $cm^{-2}$ $eV^{-1}$. The more the film thickness of the PE CVD (TEOS+$O_2$) film, the more the interface trap density. It is believed that as the film thickness is increased, the irradiation time of plasma during formation of the film is elongated, so that plasma damage degrades the $SiO_2$/Si interface.

Figure 10:
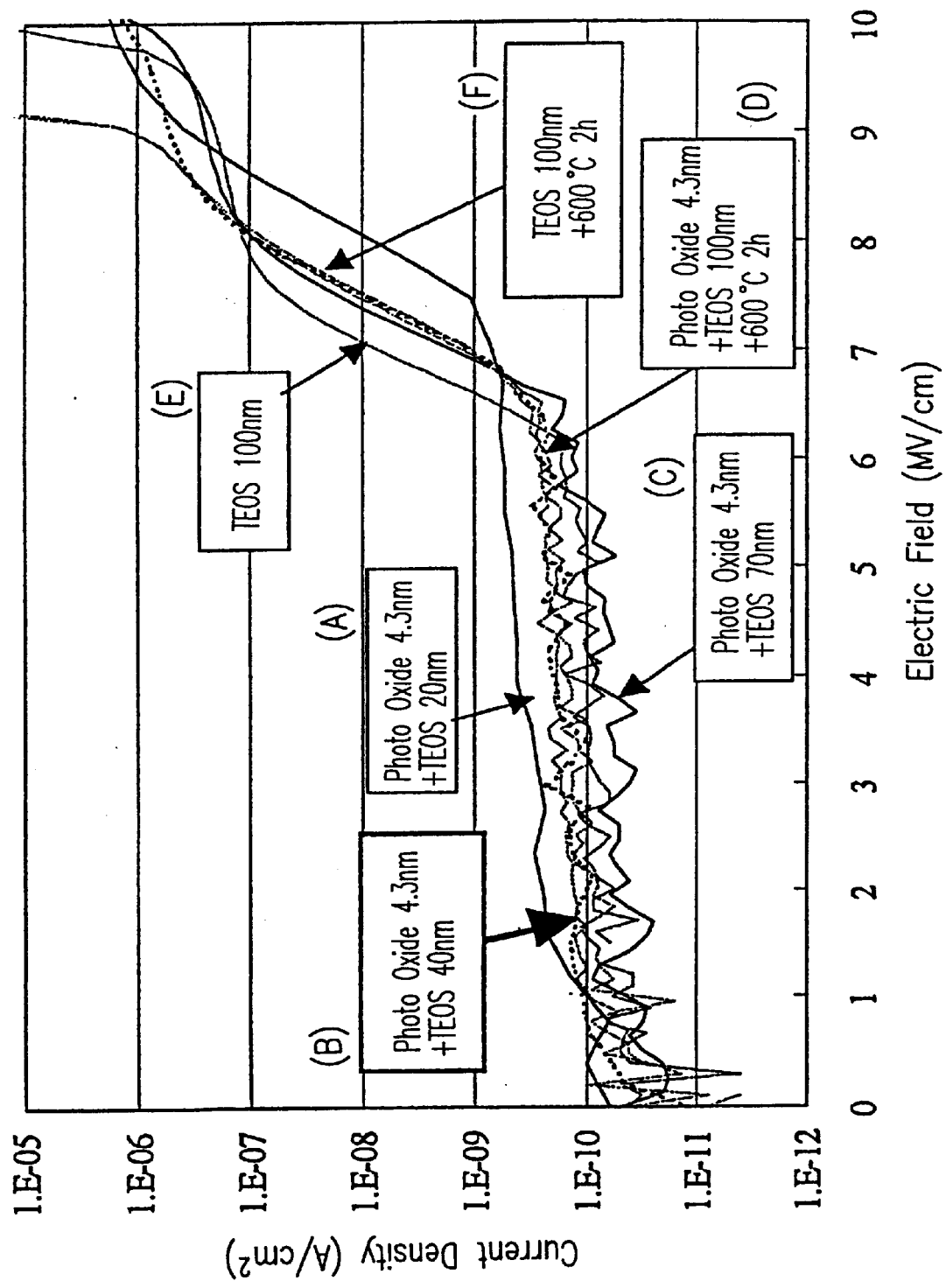
FIG. 10 is a graph showing relationships between a film thickness of a second insulator film, and current density (J) and field intensity (E), where the second insulator film is a PECVD (TEOS+$O_2$) film ($SiO_2$ film produced by plasma CVD using TEOS and $O_2$ gases) provided on a photo-oxidation film which is used as the insulator film of the present invention, or provided on the semiconductor according to a comparative example.

FIG. 10 is a graph showing relationships between a film thickness of a second insulator film, and current density (J) and field intensity (E), where the second insulator film is a PECVD (TEOS+$O_2$) film ($SiO_2$ film produced by plasma CVD using TEOS and $O_2$ gases) provided on a photo-oxidation film which is used as the insulator film of the present invention, or provided on the semiconductor according to a comparative example.

FIG. 10(A) shows a relationship between current density and field density of a substrate of the present invention on which a photo-oxidation film having a film thickness of 4.3 nm was formed and thereafter a second insulator film ($SiO_2$ film) having a film thickness of 20 nm was formed by plasma CVD using TEOS and $O_2$ gases.

FIG. 10(B) shows a relationship between current density and field density of a substrate of the present invention on which a photo-oxidation film having a film thickness of 4.3 nm was formed and thereafter a second insulator film (SiO$_2$ film) having a film thickness of 40 nm was formed by plasma CVD using TEOS and O$_2$ gases.

FIG. 10(C) shows a relationship between current density and field density of a substrate of the present invention on which a photo-oxidation film having a film thickness of 4.3 nm was formed and thereafter a second insulator film (SiO$_2$ film) having a film thickness of 70 nm was formed by plasma CVD using TEOS and O$_2$ gases.

FIG. 10(D) shows a relationship between current density and field density of a substrate of the present invention on which a photo-oxidation film having a film thickness of 4.3 nm was formed and thereafter a second insulator film (SiO$_2$ film) having a film thickness of 97 nm was formed by plasma CVD using TEOS and O$_2$ gases, followed by annealing for two hours at 600° C.

FIG. 10(E) shows a relationship between current density and field density of a substrate of a comparative example on which an oxidation film having a film thickness of 100 nm was formed by plasma CVD using TEOS and O$_2$ gases.

FIG. 10(F) shows a relationship between current density and field density of a substrate of a comparative example on which an oxidation film having a film thickness of 100 nm was formed by plasma CVD using TEOS and O$_2$ gases, followed by annealing for two hours at 600° C.

The substrates of FIGS. 10(A) through 10(F) correspond to the respective substrates of FIGS. 8(A) through 8(C) and FIGS. 8(E) through 8(G).

As shown in FIGS. 10(B), (C) and (D), when a PE CVD (TEOS+O$_2$) film having a film thickness of 40 nm or more was provided on a photo-oxidation film having a thickness of 4.3 nm, a leakage current density (current density (J) where field intensity (E)=2 MV/cm) was $1 \times 10^{-10}$ Acm$^{-2}$ or less.

As shown in FIGS. 10(A) through 10(F), a breakdown voltage (field intensity (E) where current density (J)=$1 \times 10^{-8}$ Acm$^{-2}$) was 8 MVcm$^{-1}$ or more irrespective of the film thickness of the PE CVD (TEOS+O$_2$) film provided on the photo-oxidation film.

As described above, the substrate (as shown in FIG. 10(B)), in which a SiO$_2$ film having a film thickness of 40 nm was formed on a photo-oxidation film having a film thickness of 4.3 nm by plasma CVD using TEOS and O$_2$ gases, had substantially the same electric characteristics in spite of low temperature and half the film thickness, as compared to a standard polysilicon TFT insulator film (substrate as shown in FIG. 10(F) obtained by film formation (100 nm) using a TEOS gas and about 600° C. annealing).

Further, in order to improve interfacial quality, after photo-oxidation, the temperature of the substrate was increased in the optical cleaning/photo-oxidation chamber 2 so as to try thermal annealing. When the substrate temperature was 350 to 400° C., the heating duration was 10 minutes, and the thickness of the photo-oxidation layer was 3 nm, the interface fixed charge was improved from $1 \times 10^{11}$ cm$^{-2}$ to $8 \times 10^{10}$ cm$^{-2}$. This is because the crystallinity of a transition layer from Si to SiO$_2$ was improved. In this case, the substrate temperature was 350 to 400° C., or alternatively, may be less than or equal to these temperatures.

However, such a process is time-consuming. A hydrogen plasma treatment was studied as an alternative. After the substrate 100 was subjected to photo-oxidation in the optical cleaning/photo-oxidation chamber 2, the substrate 100 was transferred to a hydrogen plasma/film formation chamber 3 having a capacity of 80000 cm$^3$ and comprising a parallel-plate electrode 110 including an anode electrode 104 and a cathode electrode 103 where a distance between the two electrodes was 2 cm (the anode electrode 103 and the cathode electrode 104 each have a size of 30×30 cm). Thereafter, hydrogen plasma treatment was conducted for three minutes where the substrate temperature was 350° C., the flow rate of hydrogen gas was 1000 sccm, the gas pressure was 1.3 torr, the source power was 450 W, and the pressure of the hydrogen plasma/film formation chamber 3 was 0.6 torr.

Since the weight of hydrogen is small, ion bombardment would not cause ion damage. Further, hydrogen terminates dangling bonds which are present in the transition layer and which cause changes in crystal structure, thereby providing an advantage of reducing defect density. Thereafter, a SiH$_4$ gas having a flow rate of 5 sccm and a N$_2$O gas having a flow rate of 1000 sccm were introduced into the hydrogen plasma/film formation chamber 3 to produce a SiO$_2$ film where the gas pressure was held at 1.3 torr and the RF source power was 450 W. In this hydrogen plasma treatment, when the photo-oxidation layer was 3 nm thick, the interface fixed charge was improved from $1 \times 10^{11}$ cm$^{-2}$ to $8 \times 10^{10}$ cm$^{-2}$. In this case, the substrate temperature was 350 to 400° C., or alternatively, may be less than or equal to these temperatures.

Alternatively, the object of the present invention may achieve a second insulator film (SiO$_2$ film) using TEOS and O$_2$ gases. Of course, a film produced by plasma CVD using SiH$_4$ and N$_2$O gases has an advantage of reducing a carbon concentration in the film, compared to a film produced using TEOS and O$_2$ gases.

Next, a SiO$_2$ film (second insulator film) produced by plasma CVD using SiH$_4$ and N$_2$O gases was assessed on a refractive index and an etching rate. As a result, the resultant substrate had practicable characteristics in the substrate temperature range from 100° C. to 400° C.

Taking the above-described results into consideration, a first insulator film (SiO$_2$ film) was produced by the photo-oxidation of Example 1 and thereafter, a SiO$_2$ film was produced by plasma CVD using SiH$_4$ and N$_2$O gases at a substrate temperature from 100° C. to 400° C. Thereafter, a specimen to be measured on its electric capacitance was produced and measured on capacitance-voltage characteristics.

As a result, it was found that the interface fixed charge density was in the range from $1 \times 10^{11}$ cm$^{-2}$ to $2 \times 10^{11}$ cm$^{-2}$ which is a practical level, and the second insulator film could be produced using SiH$_4$ and N$_2$O gases in a substrate temperature of 100° C. to 400° C.

Of course, the second insulator film can be produced by photo CVD.

EXAMPLE 2

In Example 1, a substrate is made of single-crystal silicon. In Example 2, based on the results of Example 1, a polycrystal silicon thin film transistor (poly-Si TFT) formed on a glass substrate for a liquid crystal display apparatus will be described.

FIG. 11 shows a process flow in which the present invention is applied to production of n-channel and p-channel polycrystal silicon thin film transistors for a liquid crystal display apparatus. FIG. 11(a) shows a process flow of a conventional technique for producing a polycrystal silicon thin film transistor. FIG. 11(b) shows a portion of a process flow of the present invention which is different from that of the conventional technique.

FIGS. 12A–E show cross-sections of elements in separate processes.

The glass substrate 200 was made of a glass having a size of 320 nm×400 nm×1.1 nm.

On the washed glass substrate 200, an oxide silicon film ($SiO_2$ film) having a thickness of 200 nm was formed by PE-CVD (plasma CVD) using a TEOS gas, serving as a base coat film 201 (step 1101). Thereafter, an amorphous silicon film having a thickness of 50 nm was produced by PE-CVD using $SiH_4$ and $H_2$ gases (step 1102). Since this amorphous silicon film contained 5 to 15 atom % of hydrogen, if the amorphous silicon film is irradiated with laser as it is, hydrogen becomes gas and rapidly expands its volume, so that the film is blown out. Therefore, the glass substrate 200 on which the amorphous silicon film was provided was heated to 350° C. or more, at which temperature hydrogen bonds are cut, for about one hour (step 1103).

Thereafter, pulsed light (670 mJ/pulse) having a wavelength of 308 nm from a xenon chloride (XeCl) excimer laser light source was converted by an optical system to a light beam having an area of 0.8 mm×130 mm (360 $mJ/cm^2$), with which the amorphous silicon film on the glass substrate 200 was irradiated (step 1104). The amorphous silicon absorbed the laser light and melted into a liquid phase. Thereafter, the amorphous silicon is allowed to be cooled into a solid phase, resulting in polycrystal silicon. The laser light is pulsed light of 200 Hz. Melting and solidification are finished within a one-pulse duration. Therefore, with laser irradiation, melting and solidification are repeated every pulse. When a substrate is irradiated with laser while it is moved, a large area of the substrate can be crystallized. In order to prevent variations in characteristics, irradiation areas of individual laser beams were overlapped by 95 to 97.5%.

Figure 12A:
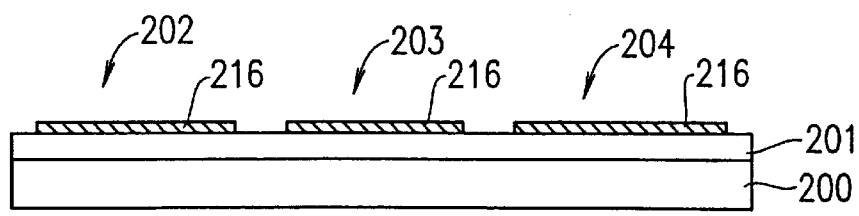
FIGS. 12A through 12E are cross-sectional views of a device when the present invention is applied to production of a polycrystal silicon thin film transistor.

The resultant polycrystal silicon was patterned into an insular polycrystal silicon 216 having a source, a channel, and a drain by photolithography (step 1105) and etching (step 1106), resulting in a n-channel TFT region 202, a p-channel TFT region 203, and a pixel TFT region 204 (FIG. 12A). Thereafter, the present invention was applied to formation of an interface and an insulator film which are critically important for a poly-Si TFT.

Figure 13:
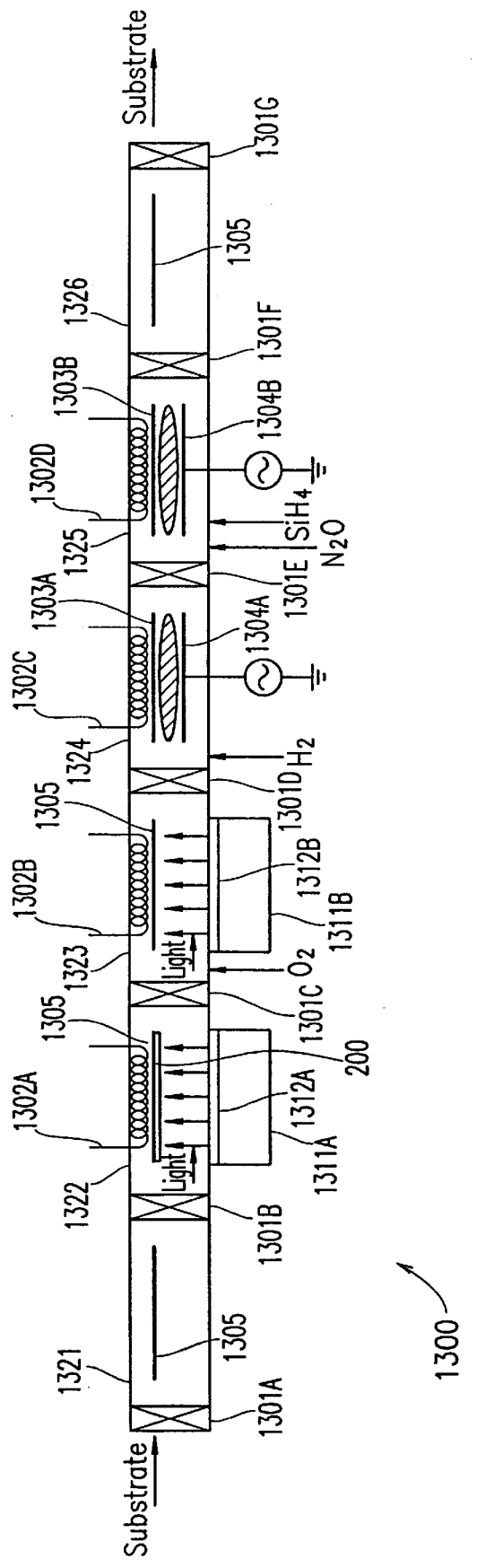
FIG. 13 is a diagram showing an apparatus for producing an insulator film according to Example 2 of the present invention.

FIG. 13 schematically shows a production apparatus 1300 for producing an insulator film according to the present invention, which is a combined thin film production apparatus comprising a thin film production apparatus using single processing type photo-oxidation and a thin film production apparatus using plasma CVD.

The glass substrate 200 having the insular polycrystal silicon 216 on the base coat film 201 was loaded into a load chamber 1321 which was in turn evacuated into vacuum through a opened gate valve 1301A. Thereafter, the gate valve 1301B was opened, and the glass substrate 200 was transferred to an optical cleaning chamber 1322, and the gate valve 1301B was closed. The substrate 200 was placed on a substrate support 1305 which had been heated to a temperature of 350° C. Thereafter, a silicon surface (surface of the insular polycrystal silicon 216) was irradiated with 172 nm-wavelength light from a xenon excimer lamp 1311A as a light source through a synthesized quartz window 1312A, thereby subjecting the silicon surface to optical cleaning (step 1151). In this case, as a light source, a low-pressure mercury lamp may be used for optical cleaning, but the excimer lamp 1311A has a higher cleaning effect. The light intensity of irradiation immediately after the synthesized quartz window 1312A was 60 $mW/cm^2$, and a distance from the window 1312A to the silicon surface was held at 25 mm. Such irradiation was conducted for 2 to 3 minutes to decompose organic substances attached onto the semiconductor surface (silicon surface 216), i.e., optical cleaning. Moreover, if a fluorine or hydrogen gas is flowed during this optical cleaning, thereby obtaining a cleaning effect having a high level of reproducibility.

Thereafter, the gate valve 1301C was opened, the substrate 200 was transferred to a photo-oxidation chamber 1323 (first reaction chamber for a first insulator film), and the gate valve 1301C was closed. Thereafter, the substrate 200 was placed on a substrate support 1305 which had been heated to a temperature of 350° C., and an oxygen gas was supplied into the photo-oxidation chamber 1323 where the pressure of the photo-oxidation chamber 1323 was held at 5 torr. The oxygen gas was directly and efficiently decomposed into highly reactive oxygen atom radicals with 172-nm wavelength light emitted from the xenon excimer lamp 1311B. The oxygen atom radicals oxidized the insular polycrystal silicon 216, resulting in a photo-oxidation film of $SiO_2$ which was to be a gate insulator film 205 (first insulator film) (step 1152). The first gate insulator film 205 (first insulator film) having a thickness of about 3 nm was grown for three minutes.

Thereafter, interface improvement annealing treatment was conducted. To this end, the gate valve 1301D was opened, the glass substrate 200 was transferred to a hydrogen plasma chamber 1324, and the gate valve 1301D. The photo-oxidation film was subjected to hydrogen plasma treatment for three minutes where the substrate temperature was 350° C., the flow rate of a $H_2$ gas was 1000 sccm, the gas pressure was held at 1.3 torr, the pressure inside the hydrogen plasma chamber 1324 was 0.6 torr, and the RF source power was 450 W (step 1153).

Thereafter, the glass substrate 200 was transferred to a film formation chamber 1325 (second reaction chamber for formation of a second insulator film), and the substrate temperature was heated to 350° C. A second gate insulator film 206 (second insulator film) of a $SiO_2$ film was produced by plasma CVD where the flow rate of a $SiH_4$ gas was 30 sccm, the flow rate of a $N_2O$ gas was 6000 sccm, the pressure inside the film formation chamber 1325 was 2 torr, and the RF source power was 450 W (step 1154). The second gate insulator film 206 having a film thickness of 97 nm was produced for three minutes.

Figure 12B:
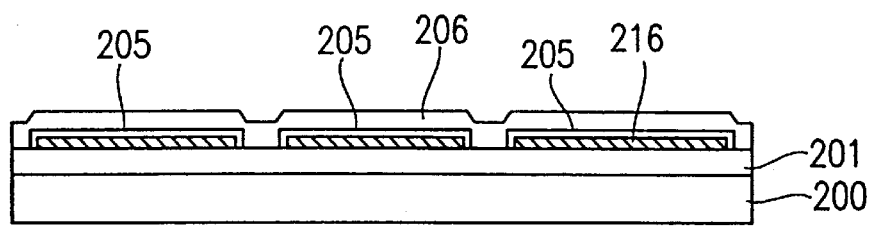
Figure 12C:
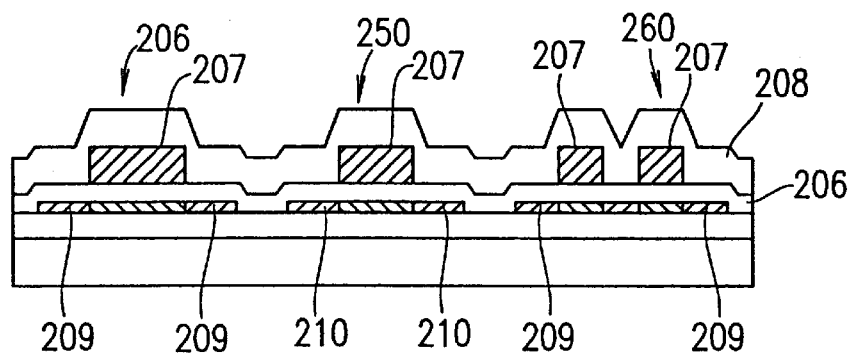
Figure 12D:
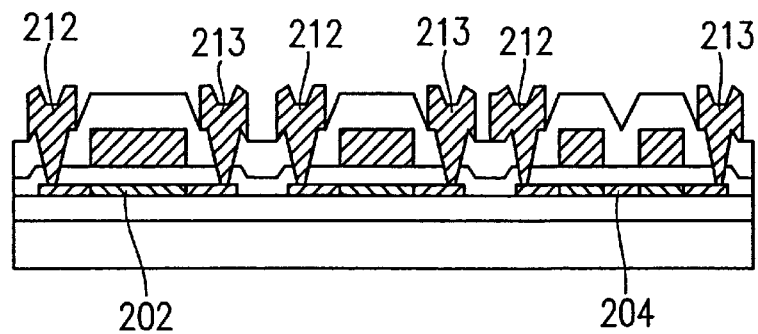
Figure 12E:
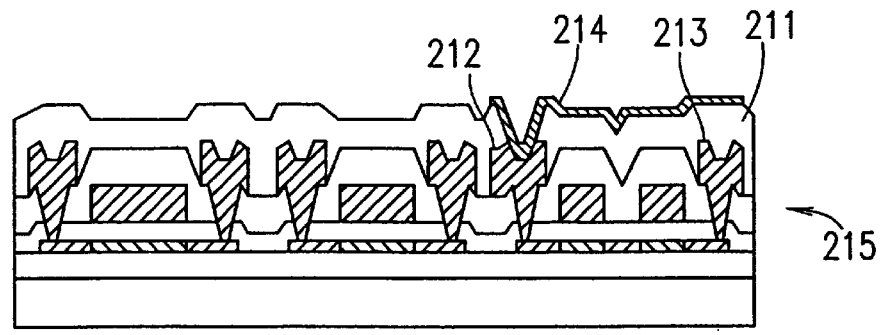

Thereafter, the substrate 200 was transferred to an unload chamber 1326, from which the substrate 200 was in turn removed (FIG. 12B).

According to the production apparatus 1300 of the present invention, the formation of the first gate insulator film 205 by the steps of optical cleaning (step 1151), photo-oxidation (step 1152), interface improvement annealing (step 1153), and plasma CVD (step 1154) could be conducted continuously in a vacuum without a reduction in productivity. Therefore, a satisfactory interface between the semiconductor and the first gate insulator film 205 was produced and a practical, thick insulator film could be quickly produced.

Thereafter, a poly-Si TFT was produced by the same steps as those of a conventional technique.

The substrate 200 was subjected to annealing in the presence of a nitrogen gas for two hours where the substrate temperature was 350° C., resulting in a high-density first gate insulator film 205 of a $SiO_2$ film (step 1108). This high-density treatment produced the high-density $SiO_2$ film, leading to an improvement in leakage current and breakdown voltage.

Thereafter, a film of Ti having a thickness of 100 nm was formed by sputtering as a barrier metal and similarly, a film of Al having a thickness of 400 nm was formed by sputtering (step 1109). The Al metal layer was subjected to photolithography patterning (steps 1110 and 1111), thereby producing a gate electrode 207.

In a subsequent photolithography process, only a p-channel TFT 250 was covered with photoresist (step 1112). Thereafter, n$^+$ source and drain contact portions 209 of an n-channel TFT 260 were doped with phosphorus at 80 keV into $6 \times 10^{15}/cm^2$ by ion doping using the gate electrode 207 as a mask (step 1113).

In a subsequent photolithography process, the n-channel TFT 260 of the n-channel TFT region 202 and the pixel TFT region 204 was covered with a photoresist (step 1114). A P$^+$ source and drain contact portions 210 of the p-channel TFT 250 in the p-channel region 203 was doped with boron at 60 keV into a boron concentration of $1 \times 10^{16}/cm^2$ by ion doping using the gate electrode 207 as a mask (step 1115).

Thereafter, the substrate 200 was subjected to annealing for two hours where the substrate temperature was 350° C. (step 1116), whereby doped phosphorus and boron ions were activated. Thereafter, an interlayer insulator film 208 of SiO$_2$ was produced by plasma CVD using a TEOS gas (FIG. 12C) (step 1117).

Thereafter, contact holes to the n$^+$ source and drain contact portions 209 and P$^+$ source and drain contact portions 210 are provided in the second gate insulator film 206 and the interlayer insulator film 208 by patterning (steps 1118 and 1119). A film of Ti having a thickness of 100 nm was provided as a barrier metal (not shown) by sputtering, and a film of Al having a thickness of 400 nm was provided by sputtering (step 1120). A source electrode 213 and a drain electrode 212 were formed by photolithography patterning (FIG. 12D) (steps 1121 and 1122).

Further, a protection film 211 of a SiO$_2$ film having a thickness of 300 nm was produced by plasma CVD (step 1123). A contact hole to an ITO pixel electrode 214 (described below) was formed in a drain portion 212 of the n-channel TFT 260 of the pixel TFT 204 region by patterning (steps 1124 and 1125).

Thereafter, hydrogen plasma treatment was conducted for three minutes in the production apparatus 1300 where the substrate temperature was 350° C., the flow rate of a H$_2$ gas was 1000 sccm, the gas pressure was 1.3 torr, and the RF source power was 450 W step 1126).

Thereafter, the substrate was transferred to another reaction chamber, followed by formation of an ITO film having a thickness of 150 nm (step 1127). The ITO film was subjected to photolithography patterning to form a pixel electrode 214 (steps 1128 and 1129). Thus, a TFT substrate 215 was completely produced (FIG. 12E) (step 1130).

Polyimide was applied to the TFT substrate 215 and a glass substrate (not shown) on which a color filter had been provided, followed by rubbing. These substrates were attached together. The attached substrates were cleaved into panels (step 1131).

These panels were loaded into a vacuum bath. An intake of each panel was immersed in liquid crystal poured into a dish. Air was introduced into the bath so that the pressure of the air caused the liquid crystal to enter the panel. The intake was sealed with a resin, resulting in a liquid crystal panel.

Thereafter, polarizing plates were attached to the liquid crystal panel, which was in turn combined with peripheral circuitry, a backlight, a bezel, and the like, resulting in a liquid crystal module (step 1132).

Such a liquid crystal module can be used in personal computers, monitors, televisions, personal digital assistants, and the like.

In Example 2, interfacial quality between a silicon oxide film and polycrystal silicon (insular polycrystal silicon), and insulator film bulk characteristics are improved. Thereby, the threshold voltage of the TFT of Example 2 was improved to 1.5 V±0.6 V, compared to 1.9 V±0.8 V in a comparative example where an SiO$_2$ film was formed by plasma CVD without a photo-oxidation layer (photo-oxidation film). A variation in the threshold voltage was reduced, resulting in a large improvement in yield. Moreover, a driving voltage was reduced, resulting in a 10% reduction in power consumption. Since a clean SiO$_2$/Si (silicon oxide film and polycrystal silicon) interface can be produced due to optical cleaning and photo-oxidation, contamination of Na ions or the like can be prevented and a variation in threshold voltage can be reduced, resulting in an improvement in reliability.

EXAMPLE 3

In Example 1, single-crystal silicon was used as a material for a substrate. In Example 2, the present invention was applied to production of n-channel and p-channel polycrystal silicon thin film transistors which are used in a liquid crystal display apparatus. In Example 3, the present invention was applied to production of n-channel and p-channel polycrystal silicon thin film transistors which are formed on a plastic substrate. Hereinafter, a plastic substrate will be described, for example. The present invention is not limited to this. A resin substrate may be used.

Figure 14:
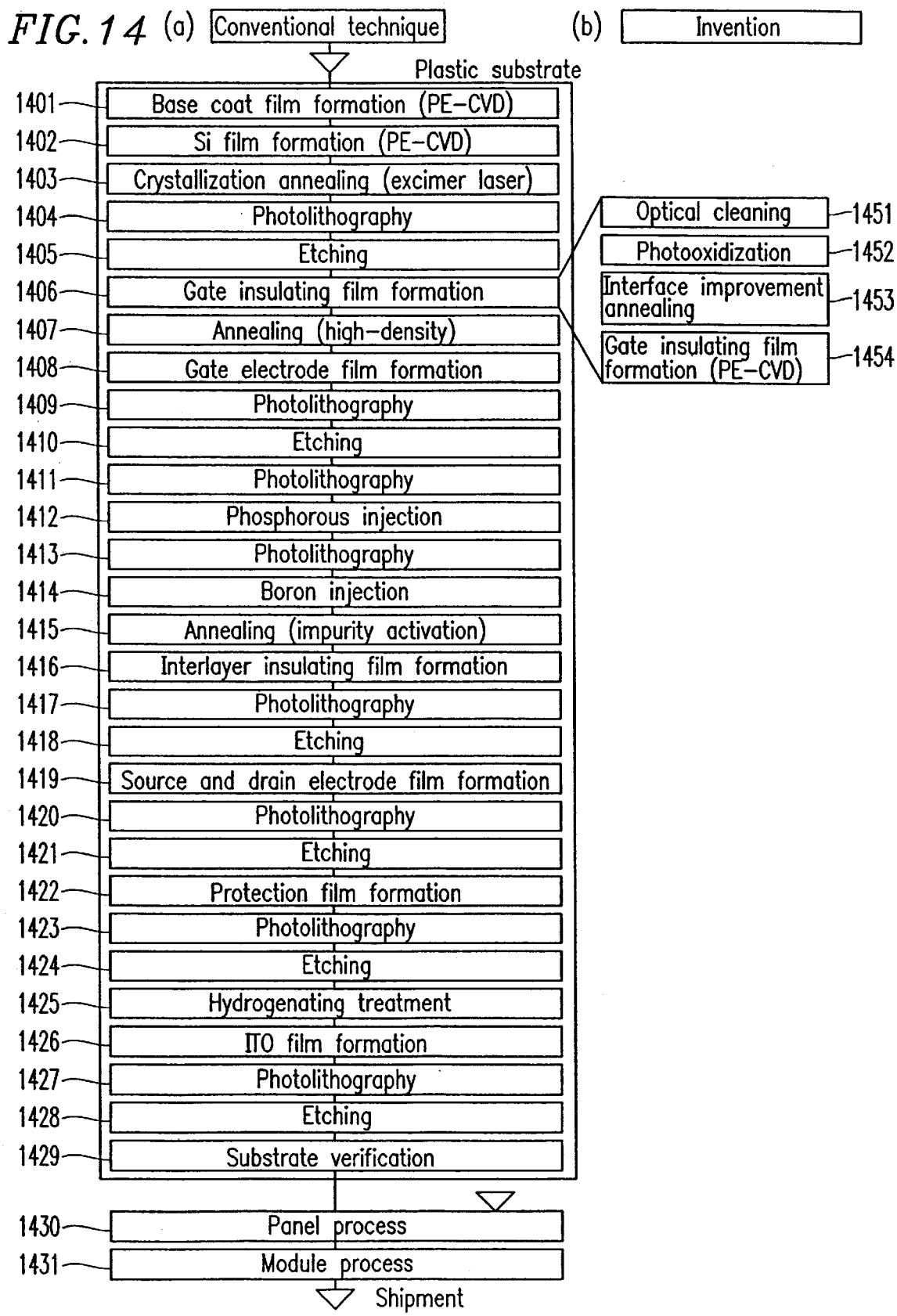
FIG. 14 is a diagram showing a process flow when the present invention is applied to production of polycrystal silicon thin film transistors on a plastic substrate.

FIG. 14 is a diagram showing a process flow when the present invention is applied to production of n-channel and p-channel polycrystal silicon thin film transistors on a plastic substrate.

FIG. 14(*a*) shows a process flow of a conventional technique for producing a polycrystal silicon thin film transistor on a plastic substrate. FIG. 14(*b*) shows a portion of a process flow of the present invention which is different from the conventional technique shown in FIG. 14(*a*). FIG. 14 is different from FIG. 12 in that a polycrystal silicon thin film transistor is provided on a plastic substrate, but not a glass substrate.

First, a 20 nm-thick and 127 mm×127 mm-sized substrate of polyether sulfone (PES) was subjected to 15-hour annealing at 200° C. in order to prevent expansion of the plastic substrate.

Thereafter, a 300-nm thick SiO$_2$ film was formed on a rear side of the plastic substrate at 200° C. by sputtering in order to prevent damage due to a gas and a drug released from the plastic substrate.

On an upper surface of the plastic substrate, a 400-nm thick SiO$_2$ film and a 50-nm thick amorphous silicon film were continuously produced as a base coat film by sputtering while keeping a vacuum (steps 1401 and 1402). In this case, since the amorphous silicon film by sputtering did not contain hydrogen, dehydrogenation annealing was not required.

Thereafter, pulsed light (670 mJ/pulse) having a wavelength of 308 nm from a xenon chloride (XeCl) excimer laser light source was converted by an optical system to a light beam having an area of 0.8 mm×130 mm (360 mJ/cm$^2$), with which the amorphous silicon film on the plastic substrate was irradiated so as to crystallize a front side of the substrate while the substrate was moved (step 1403). In this case, irradiation areas of individual laser beams were overlapped by 97.5%. Further, the film thickness of the base coat film was increased to 300 nm or more, thereby making it possible to crystallize amorphous silicon film (into polycrystal silicon) with pulsed light without damage of the plastic substrate.

The resultant polycrystal silicon was patterned into insular polycrystal silicon by photolithography and etching (steps 1404 and 1405).

Thereafter, the present invention was applied to formation of an interface and an insulator film which are critically important for a poly-Si TFT. In this case, the insulator film was produced using the same production apparatus 50 as that of Example 1 (FIG. 1).

After the gate valve 101A was opened, a plastic substrate 100 of PES having an insular polycrystal silicon on a base coat film was loaded into the load chamber 1 which was in turn evacuated into vacuum. After the gate valve 101B was opened, the plastic substrate 100 is transferred to the optical cleaning/photo-oxidation chamber 2 (first reaction chamber for production of a first insulator film) and the gate valve 101B was closed. The plastic substrate 100 was placed on the substrate support 105 which had been heated to a temperature of 200° C. Thereafter, a silicon surface (surface of the insular polycrystal silicon) was irradiated with 172 nm-wavelength light from the xenon excimer lamp 11 through the synthesized quartz window 12, thereby subjecting the silicon surface to optical cleaning (step 1451). In this case, the light intensity of the irradiation immediately after the synthesized quartz window 12 was 60 mW/cm$^2$, and a distance from the window 12 to the silicon surface was held at 25 mm.

Thereafter, an oxygen gas was supplied into the optical cleaning/photo-oxidation chamber 2 where the pressure inside the photo-oxidation chamber 2 was held at 5 torr. The oxygen gas was directly and efficiently decomposed into highly reactive oxygen atom radicals with 172-nm wavelength light emitted from the xenon excimer lamp 11. The oxygen atom radicals oxidized the insular polycrystal silicon. With a six-minute reaction, a silicon oxide film having a thickness of about 3 nm was produced (step 1452).

Thereafter, the gate valve 101C was opened, the plastic substrate 100 was transferred to a hydrogen plasma/film formation chamber 3 (second reaction chamber for formation of a second insulator film). The photo-oxidation film was subjected to hydrogen plasma treatment for three minutes where the substrate temperature was 200° C., the flow rate of a H$_2$ gas was 1000 sccm, the gas pressure was held at 1.3 torr, and the RF source power was 450 W (step 1453).

Thereafter, in the same hydrogen plasma/film formation chamber 3, a SiO$_2$ film was produced by plasma CVD where the substrate temperature was 200° C., the flow rate of a SiH$_4$ gas was 5 sccm, the flow rate of a N$_2$O gas was 1000 sccm, the gas pressure was 1.3 torr, and the RF source power was 450 W (step 1454). With a three-minute reaction, an SiO$_2$ film having a film thickness of 97 nm was produced.

In the remaining steps (steps 1407–1429), a poly-Si TFT was produced by basically the same steps (steps 1108–1130) of those of Example 2 except that the substrate temperature was 200° C. or less. Steps for formation of liquid crystal (step 1430) and a module (step 1431) are basically the same as those (steps 1131 and 1132) in Example 2.

A liquid crystal module comprising the above-described plastic substrate has a small weight, is flexible, is not brittle, and the like, and may be used in personal computers, monitors, televisions, personal digital assistants, and the like.

The present invention can be applied to materials, such as for example single-crystal silicon in Example 1, polycrystal silicon on a glass substrate in Example 2, and polycrystal silicon on a plastic substrate in Example 3.

Further, in addition to the thin film transistors of Examples 2 and 3, the present invention can be applied to production of a semiconductor device, which cannot be density of 1×10$^{11}$ cm$^{-2}$ or less at an interface between a single-crystal or polycrystal silicon material and a silicon oxide film, an interface trap density of 1×10$^{11}$ cm$^{-2}$ eV$^{-1}$ or less, a nitrogen concentration of 1 atom % or less, and a carbon concentration of 1×10$^{20}$ atoms/cm$^3$ or less in the silicon material. Therefore, the present invention can be applied to a wide variety of semiconductor devices, such as for example a single-crystal silicon MOS transistor.

Furthermore, the present invention provides an apparatus comprising a reaction chamber in which a semiconductor surface of single-crystal silicon or polycrystal silicon is oxidized in an atmosphere containing oxygen atom radicals, and another reaction chamber in which a second insulator film is formed on a first insulator film by deposition without exposing the first insulator film to outside air. Such an apparatus has no conventional example.

According to the production method of the present invention, a surface of a single-crystal or polycrystal silicon semiconductor is oxidized with oxygen atom radicals without plasma damage and in a quick manner at a semiconductor temperature of 600° C. or less. Thereby, a satisfactory interface between the semiconductor and a gate insulator film is produced, and a practical, thick insulator film is quickly produced. Therefore, a polycrystal silicon TFT produced by this method is inexpensive and has improved characteristics. Further, satisfactory interfacial qualities can be reproduced with high reproducibility, thereby reducing a variation in characteristics and improving yield.

Conventional semiconductor devices comprise a silicon thin film and a silicon oxide film provided on a glass, metal foil or resin substrate. Among conventional semiconductor devices, there is no one that has all of the following properties: a fixed charge density of 1×10$^{11}$ cm$^{-2}$ or less; an interface trap density of 1×10$^{11}$ cm$^{-2}$ eV$^{-1}$ or less, a nitrogen concentration of 1 atom % or less; and a carbon concentration of 1×10$^{20}$ atoms/cm$^3$ or less in the silicon material. The present invention is the first to provide such a semiconductor device. Therefore, the present invention can be applied to production of various high-performance semiconductor devices other than thin film transistors.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for forming an insulator film at a semiconductor temperature of 600° C. or less, comprising the steps of:

forming a first insulator film by oxidizing a surface of a semiconductor in an atmosphere containing oxygen radicals;

forming a second insulator film on the first insulator film by deposition without exposing the first insulator film to outside air; and interface improvement annealing between the forming of the first insulator film and the forming of the second insulator film.

2. A method according to claim 1, wherein the first insulator film forming step comprises generating the oxygen atom radicals by irradiating an atmosphere containing an oxygen gas with light having a wavelength of 175 nm or less.

3. A method according to claim 2, wherein, the first insulator film forming step comprises generating the oxygen atom radicals by irradiating an atmosphere containing an oxygen gas with light having a wavelength of 172 nm, the light emitted from a xenon excimer lamp.

4. A method according to claim 2, wherein the first insulator film forming step comprises generating the oxygen atom radicals by irradiating an atmosphere containing an oxygen gas having a partial pressure of 0.05 torr to 50 torr with light having a wavelength of 172 nm, the light emitted from a xenon excimer lamp.

5. A method according to claim 1, further comprising, prior to the first insulator film forming step, the step of cleaning the surface of the semiconductor by irradiating the surface of the semiconductor with light having a wavelength of 175 nm or less in an atmosphere having substantially no oxygen.

6. A method according to claim 1, wherein the first insulator film forming step comprises generating the oxygen atom radicals by plasma CVD, wherein there is a predetermined distance or more between a plasma generating site and the surface of the semiconductor.

7. A method according to claim 1, wherein the first insulator film forming step comprises forming the first insulator film wherein a temperature of the semiconductor is in the range from 100° C. to 500° C.

8. A method according to claim 1, wherein the first insulator film forming step comprises forming the first insulator film wherein the formed first insulator film has a thickness in the range from 0.5 nm to 20 nm.

9. A method according to claim 1, wherein the first insulator film forming step comprises mixing the atmosphere with a hydrogen or fluorine gas.

10. A method according to claim 1, wherein the interface improvement annealing step includes performing thermal annealing at the temperature of the semiconductor or less of the first and second insulator forming steps.

11. A method according to claim 1, wherein the interface improvement annealing step includes subjecting the first insulator film to hydrogen plasma treatment at the temperature of the semiconductor or less of the first and second insulator film forming steps.

12. A method according to claim 2, wherein the second insulator film forming step comprises depositing the second insulator film by plasma CVD.

13. A method according to claim 12, wherein the second insulator film depositing step comprises performing the deposition where a temperature of the semiconductor is in the range from 100° C. to 400° C.

14. A method according to claim 12, wherein the second insulator film depositing step comprises performing the deposition of the second insulator film using at least silane-based and nitrogen monoxide gases.

15. A method according to claim 1, wherein the second insulator film forming step comprises depositing the second insulator film by photo CVD.

16. A method according to claim 1, wherein the semiconductor is single-crystal silicon.

17. A method according to claim 1, wherein the semiconductor is polycrystal silicon.

18. A method according to claim 1, wherein the semiconductor is a silicon thin film of polycrystal silicon provided on a substrate of at least glass, metal foil, or resin.

19. A semiconductor device, comprising an insulator film formed by a method according to claim 1.

20. A semiconductor device according to claim 19, wherein the semiconductor device is a silicon thin film transistor.

21. A method according to claim 1, wherein the second insulator film forming step comprises forming the second insulator film wherein the second insulator film has a thickness in the range from 20 nm to 100 nm.

22. A method according to claim 1, wherein the steps of forming the first insulator film and forming the second insulator film comprise forming the first insulator film and the second insulator film wherein the total thickness is about 100 nm.

* * * * *